United States Patent
En

(10) Patent No.: US 7,514,637 B1
(45) Date of Patent: Apr. 7, 2009

(54) ELECTROPLATING SOLUTION, METHOD FOR FABRICATING MULTILAYER PRINTED WIRING BOARD USING THE SOLUTION, AND MULTILAYER PRINTED WIRING BOARD

(75) Inventor: Honchin En, Gifu (JP)

(73) Assignee: Ibiden Co., Ltd., Gifu (JP)

( * ) Notice: Subject to any disclaimer, the term of this patent is extended or adjusted under 35 U.S.C. 154(b) by 93 days.

(21) Appl. No.: 10/048,852

(22) PCT Filed: Jul. 4, 2000

(86) PCT No.: PCT/JP00/04418

§ 371 (c)(1),
(2), (4) Date: Apr. 11, 2002

(87) PCT Pub. No.: WO01/11932

PCT Pub. Date: Feb. 15, 2001

(30) Foreign Application Priority Data

| Aug. 6, 1999 | (JP) | 11/224143 |
| May 26, 2000 | (JP) | 2000/156877 |
| May 26, 2000 | (JP) | 2000/156878 |
| Jun. 28, 2000 | (JP) | 2000/194619 |
| Jun. 28, 2000 | (JP) | 2000/194620 |

(51) Int. Cl.
*H05K 1/03* (2006.01)
*H05K 1/09* (2006.01)

(52) U.S. Cl. .................. 174/256; 174/257; 174/262; 29/846

(58) Field of Classification Search .......... 174/257–258, 174/260–264; 361/792–795; 29/846–847; 205/126–127; 428/209–210; 427/96–97, 427/112
See application file for complete search history.

(56) References Cited

U.S. PATENT DOCUMENTS

| 3,756,891 A | * | 9/1973 | Ryan .................. 156/313 |
| 3,904,789 A | * | 9/1975 | Speirs et al. .......... 427/253 |
| 4,009,087 A | | 2/1977 | Kardos et al. |
| 4,931,148 A | * | 6/1990 | Kukanskis et al. ...... 205/126 |
| 5,252,196 A | | 10/1993 | Sonnenberg et al. |

(Continued)

FOREIGN PATENT DOCUMENTS

EP 0419845 4/1991

(Continued)

OTHER PUBLICATIONS

Supplemental European Search Report dated Jun. 29, 2006.

(Continued)

*Primary Examiner*—Tuan Dinh
(74) *Attorney, Agent, or Firm*—Sughrue Mion, PLLC

(57) ABSTRACT

The objective of present invention is to provide an electroplating solution capable of forming the upper face of a via-hole and the upper face of a conductor circuit in the same layer in approximately the same plane at the time of manufacturing a multilayer printed circuit board. The electroplating solution of the present invention is characterized by containing 50 to 300 g/L of copper sulfate, 30 to 200 g/L of sulfuric acid, 25 to 90 mg/L of chlorine ion, and 1 to 1000 mg/L of an additive comprising at least a levelling agent and a brightener.

10 Claims, 24 Drawing Sheets
(1 of 24 Drawing Sheet(s) Filed in Color)

U.S. PATENT DOCUMENTS

| | | | |
|---|---|---|---|
| 5,328,589 A | | 7/1994 | Martin |
| 5,433,840 A | | 7/1995 | Dahms et al. |
| 5,626,736 A | * | 5/1997 | Florio et al. ................ 205/125 |
| 6,174,591 B1 | * | 1/2001 | Chu et al. .................... 428/209 |
| 6,211,485 B1 | | 4/2001 | Burgess |
| 6,255,039 B1 | | 7/2001 | Xu et al. |
| 6,309,528 B1 | | 10/2001 | Taylor et al. |
| 6,376,052 B1 | * | 4/2002 | Asai et al. ................... 428/209 |
| 6,379,520 B1 | * | 4/2002 | Kuriyama et al. ............. 205/81 |

FOREIGN PATENT DOCUMENTS

| | | |
|---|---|---|
| EP | 0930647 A | 7/1999 |
| EP | 1075172 A | 2/2001 |
| JP | 05-308194 | 11/1993 |
| JP | HEI-07-079078 | 3/1995 |
| JP | 9-130050 A | 5/1997 |
| JP | HEI-09-312472 | 12/1997 |
| JP | 11-054912 | 2/1999 |
| JP | 11-068314 | 3/1999 |
| JP | 11-186729 | 7/1999 |

OTHER PUBLICATIONS

Machine English translation of JP Hei-07-079078.
Machine English translation of JP Hei-09-312472.

* cited by examiner

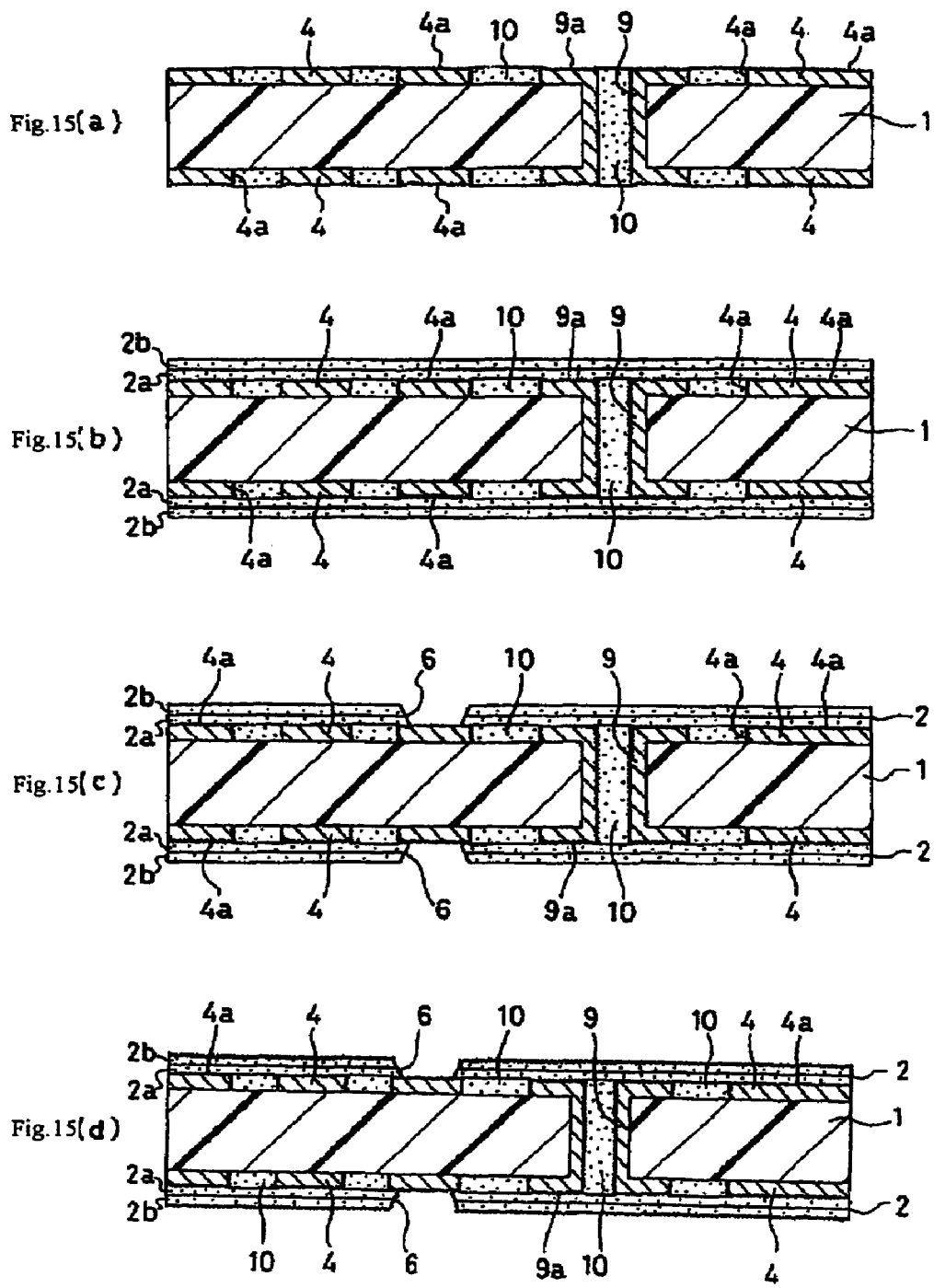

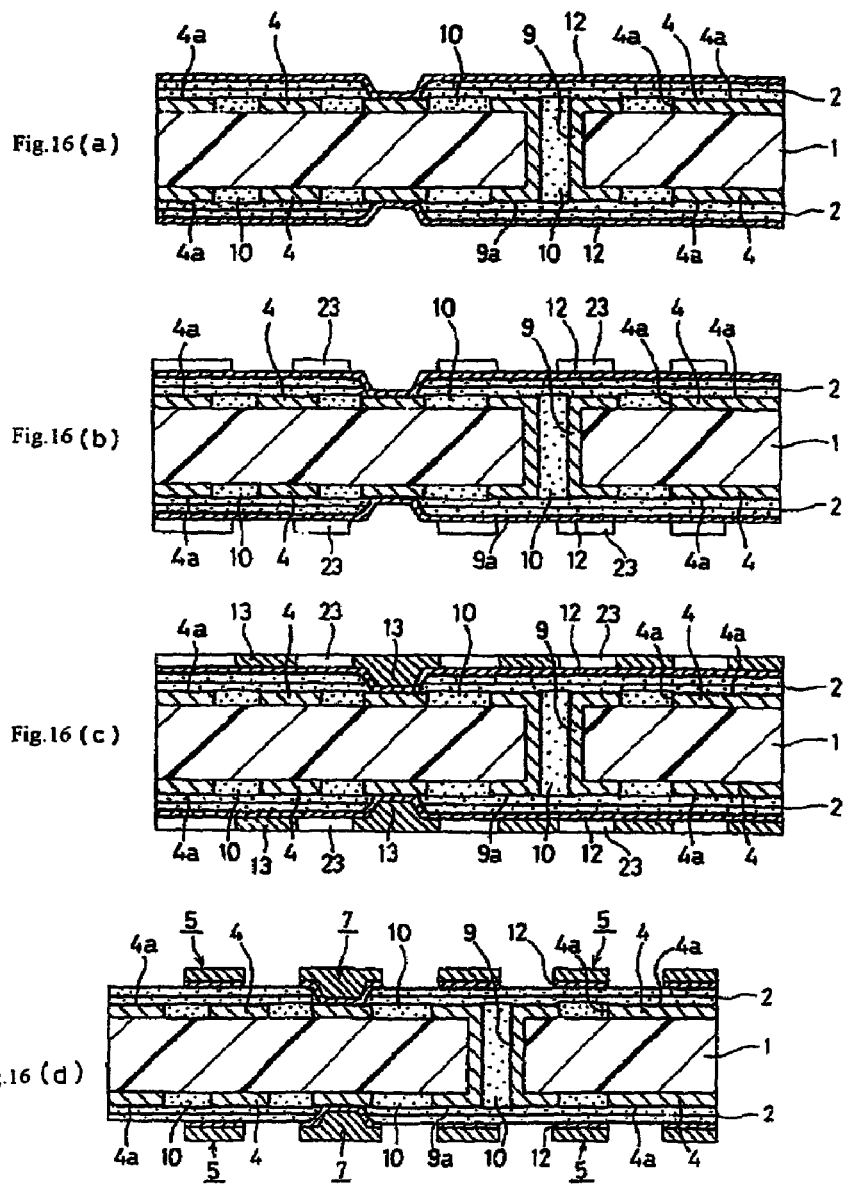

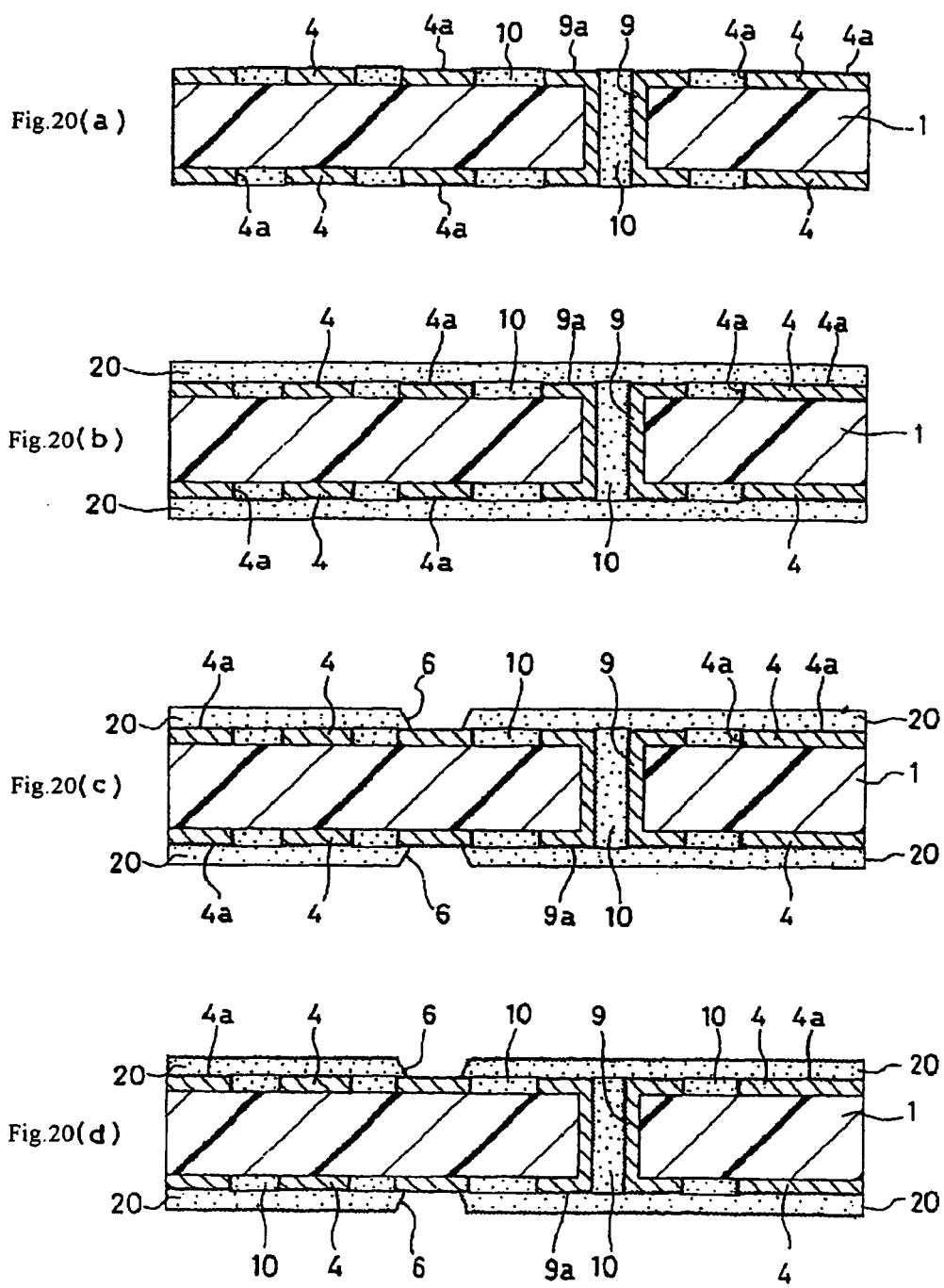

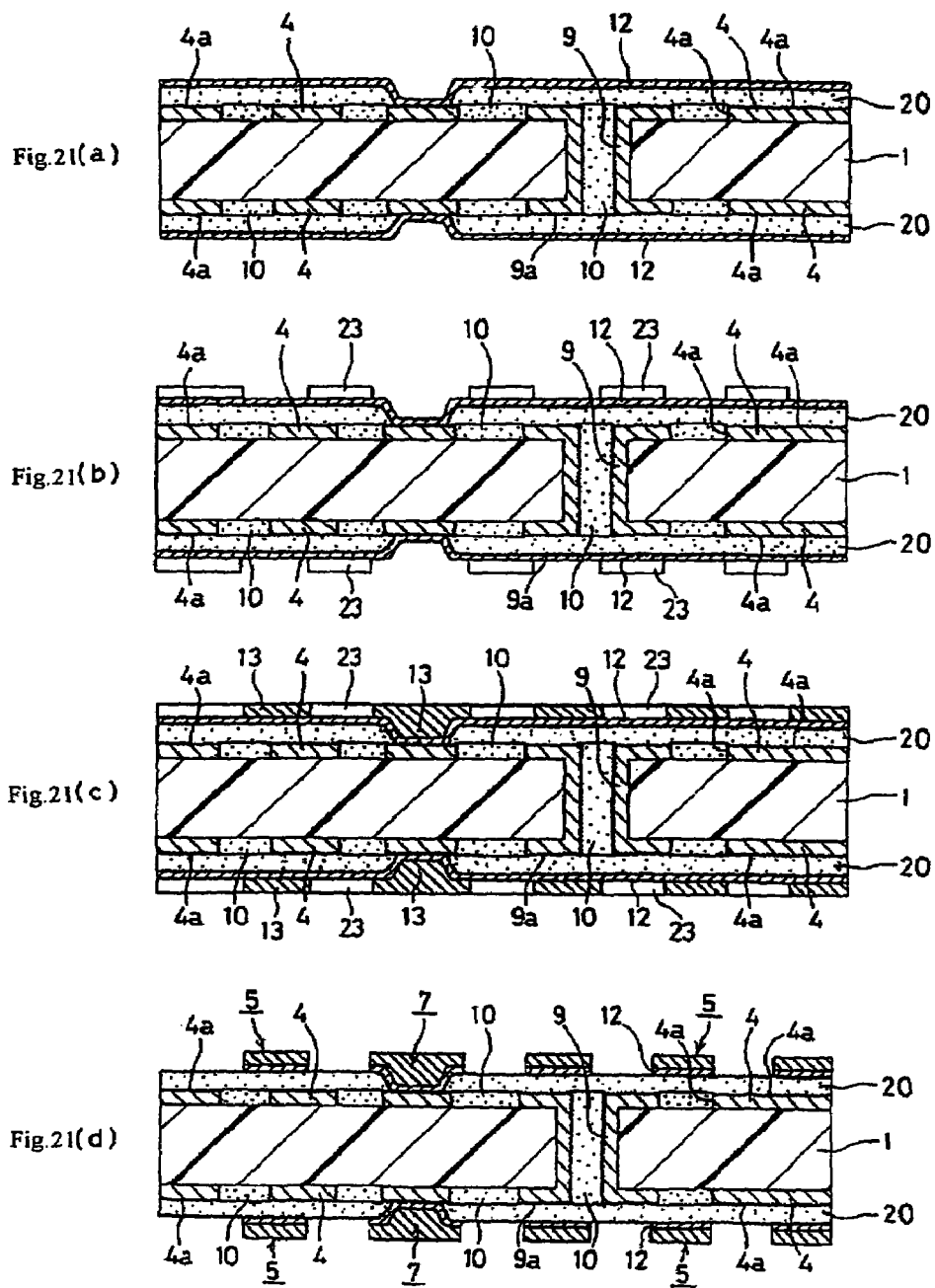

Fig. 24
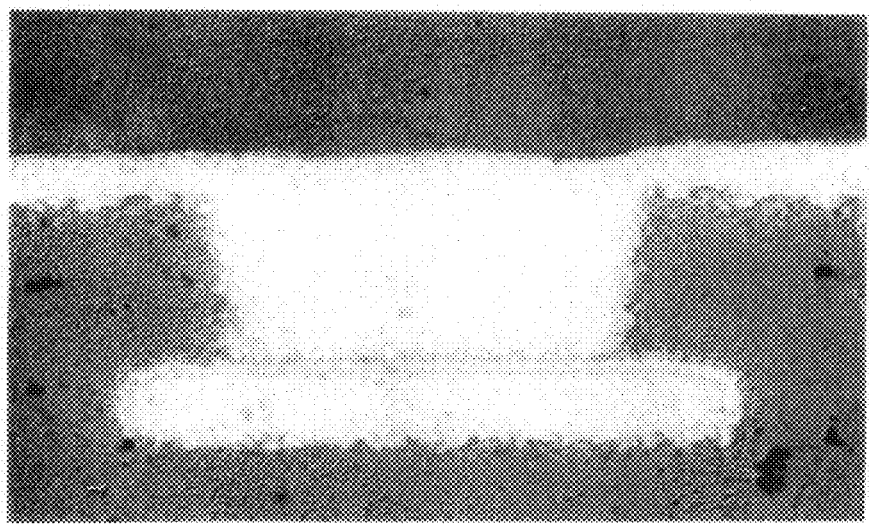
Fig. 25
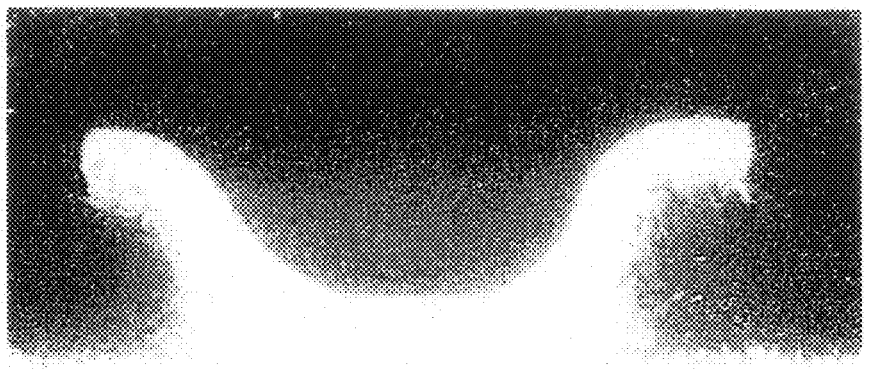
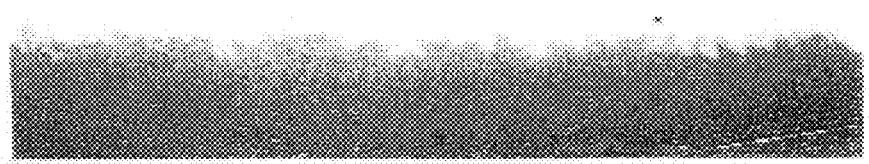

ELECTROPLATING SOLUTION, METHOD FOR FABRICATING MULTILAYER PRINTED WIRING BOARD USING THE SOLUTION, AND MULTILAYER PRINTED WIRING BOARD

This is a National stage entry under 35 U.S.C. § 371 of PCT Application No. PCT/JP00/04418 filed Jul. 4, 2000; the above noted application is all hereby incorporated by reference; the international application to which benefit is claimed was published under PCT Article 21(2) in English.

TECHNICAL FIELD

The present invention relates to an electroplating solution to be employed for manufacturing a multilayer printed circuit board, a method for manufacturing a multilayer printed circuit board using the electroplating solution, and a multilayer printed circuit board.

BACKGROUND ART

A multilayer printed circuit board so-called a multilayer-built-up wiring substrate is manufactured by a semi-additive method and the like and produced by building up a conductor circuit of copper and the like and an interlaminar resin insulating layer on a resin substrate, so-called a core, of approximately 0.5 to 1.5 mm thickness and reinforced with glass cloths and the like serially in alternate fashion and in repetition. The interconnection of the conductor circuits through the interlaminar resin insulating layer of the multilayer printed circuit board is achieved by a via-hole.

Conventionally, the multilayer-built-up printed circuit board is produced according to a method disclosed in, for example, JP H09-130050 A and the like.

That is, at first a through hole is formed in a copper-laminated laminate substrate bearing a copper foil and successively subjected to an electroless copper plating to complete the plated-through hole. Continuously, the surface of the substrate is etched in a conductor pattern to form a conductor circuit, and on the surface of the conductor circuit, a roughened surface is formed by electroless plating, etching and the like. After a resin insulating layer is then formed on the conductor circuit having the roughened surface, the resultant resin layer is subjected to exposure and development treatment to form an opening part for a via-hole and then the resin layer is subjected to UV curing and main curing treatment to form an interlaminar resin insulating layer.

Further, after the interlaminar resin insulating layer is subjected to roughening treatment by an acid, an oxidizing agent and the like, a thin metal layer is formed thereon and a plating resist is formed on the metal layer, and then thickened by electroplating. After the plating resist is separated, etching is carried out to form a conductor circuit connected with a conductor circuit of the lower layer through the via-hole.

After these processes are repeated, a solder resist layer for protecting the conductor circuit is formed finally and then such part where an opening part is exposed to connect an electronic part such as an IC chip and a mother board is plated and successively a solder bump is formed by printing a solder paste to complete the manufacture of a multilayer-built-up printed circuit board.

In manufacture of such a multilayer-built-up printed circuit board, in the case that a conductor circuit connected with a conductor circuit of a lower layer through a via-hole by carrying out electroless plating and electroplating, the opening part for a via-hole is not completely filled with a metal and as being shown in FIG. 25, a recessed part is formed in the peripheral part of the via-hole. Incidentally, FIG. 25 is a cross-section figure illustrating the cross-section of a via-hole of a conventional multilayer printed circuit board.

SUMMARY OF THE INVENTION

As described above, in a multilayer-built-up printed circuit board, the upper face of the conductor circuit, especially the peripheral part of a via-hole, is not flat, so that in the case of forming an interlaminar resin insulating layer on the upper face of conductor circuit, the interlaminar resin insulating layer is sometimes waved to result in separation of the interlaminar resin insulating layer and crack formation and disconnection of the conductor circuit to be formed on the upper layer of the interlaminar resin insulating layer as well.

Further, a stack via structure (a structure in which a via-hole is formed immediate above another via-hole, reference to FIG. 1) is required as a structure of a multilayer-built-up printed circuit board to shorten the wiring distance in order to provide a printed circuit board with high speed performance and fine structure. However, since an opening part for a via-hole in a multilayer-built-up printed circuit board manufactured by a conventional method as described above is not perfectly filled with a metal, it becomes difficult to form the stack via structure.

The inventors of the present invention have found based on the results of the enthusiastic investigation of the above described objects that an opening part for a via-hole can perfectly be filled with a metal by using an electroplating solution containing a specified amount of an additive composed of a specified levelling agent and a brightener and that the upper face of a via-hole and the upper face of a conductor circuit in the same layer can be kept approximately in the same plane and have achieved the present invention comprising the following subject matter.

That is, an electroplating solution of the present invention is an electroplating solution to be employed for manufacturing a multilayer printed circuit board composed of a substrate bearing a conductor circuit and, as serially layered thereon, a resin insulating layer and a conductor circuit in an alternate fashion and in repetition, characterized by containing 50 to 300 g/L of copper sulfate, 30 to 200 g/L of sulfuric acid, 25 to 90 mg/L of chlorine ion, and 1 to 1000 mg/L of an additive comprising at least a levelling agent and a brightener.

As the foregoing levelling agent, at least one substance selected from the group consisting of polyethylene, its derivatives, gelatin, and its derivatives is preferable to be used and as the foregoing brightener, at least one compound selected from the group consisting of sulfur oxide, compounds related to sulfur oxide, hydrogen sulfide, compounds related to hydrogen sulfide, and other sulfur compounds is preferable to be used.

A first method for manufacturing a multilayer printed circuit board of the present invention is characterized by containing at least the following processes (a) to (e):

(a) a process of forming a resin insulating layer having an opening part for a via-hole by exposure and development treatment or laser treatment;

(b) a process of forming a metal layer comprising at least one element selected from the group consisting of Cu, Ni, P, Pd, Co and W on the surface of the resin insulating layer and the opening part for a via-hole;

(c) a process of forming a plating resist on the foregoing metal layer;

(d) a process of forming an electroplating film on a part un-coated with the foregoing plating resist using an electroplating solution of the present invention; and (e) a process of forming a conductor circuit by etching the metal layer existing under the foregoing plating resist after the foregoing plating resist is separated.

Further, a second method for manufacturing a multilayer printed circuit board of the present invention comprises at least the following processes (a) to (d):

(a) a process of forming a resin insulating layer having an opening part for a via-hole by exposure and development treatment or laser treatment;

(b) a process of forming a metal layer comprising at least one element selected from the group consisting of Cu, Ni, P, Pd, Co and W on the surface of the resin insulating layer and the opening part for a via-hole;

(c) a process of forming an electroplating film on the metal layer using an electroplating solution of the present invention; and (d) a process of forming a conductor circuit by etching after an etching resist is formed on the foregoing electroplating film.

In the foregoing first and second method for manufacturing a multilayer printed circuit board of the present invention, the metal layer is preferable to be formed by sputtering, plating, or sputtering and plating in combination in the process (b).

Further, the foregoing interlaminar resin insulating layer is preferably at least one resin selected from the group consisting of a fluoro resin, a polyolefin type resin, and a polyphenylene type resin or a resin complex containing a thermoplastic resin and thermosetting resin.

Further, in the foregoing first and second method for manufacturing a multilayer printed circuit board of the present invention, at least one substance selected from the group consisting of polyethylene, its derivatives, gelatin, and its derivatives is preferable to be used as the foregoing levelling agent for the electroplating solution and at least one compound selected from the group consisting of sulfur oxide, compounds related to sulfur oxide, hydrogen sulfide, compounds related to hydrogen sulfide, and other sulfur compounds is preferable to be used as the foregoing brightener for the electroplating solution.

A multilayer printed circuit board of the present invention is a multilayer printed circuit board comprising a substrate bearing a conductor circuit and, as serially layered thereon, a resin insulating layer and a conductor circuit in an alternate fashion and in repetition, wherein the conductor circuits neighboring in up and down direction are connected through a via-hole, characterized in that the foregoing via-hole is filled with a metal, that the upper face of a via-hole and the upper face of a conductor circuit in the same layer are kept approximately in the same plane and that the distance from the bottom face to the upper face of the foregoing via-hole is about 2 to 7 times as long as the thickness of the foregoing conductor circuit.

In the foregoing multilayer printed circuit board, the foregoing resin insulating layer is preferable to have a dielectric constant of 3.0 or lower at 1 GHz.

Further, the foregoing multilayer printed circuit board is preferably manufactured by the foregoing first or second method for manufacturing a multilayer printed circuit board of the present invention.

BRIEF DESCRIPTION OF THE DRAWINGS

The patent or application file contains at least one drawing executed in color. Copies of this patent or patent application with color drawing(s) will be provided by the Office upon request and payment of the necessary fee.

FIGS. 15 (a) to (d) are cross-section figures showing a part of processes of manufacturing a multilayer printed circuit board of the present invention.

FIGS. 16 (a) to (d) are cross-section figures showing a part of processes of manufacturing a multilayer printed circuit board of the present invention.

FIGS. 20 (*a*) to (*d*) are cross-section figures showing a part of processes of manufacturing a multilayer printed circuit board of the present invention.

FIGS. 21 (*a*) to (*d*) are cross-section figures showing a part of processes of manufacturing a multilayer printed circuit board of the present invention.

FIG. 24 is a microscopic picture showing the cross-section of a via-hole of a multilayer printed circuit board of the present invention.

FIG. 25 is a microscopic picture showing the cross-section of a via-hole of a conventional multilayer printed circuit board.

Figure 1:
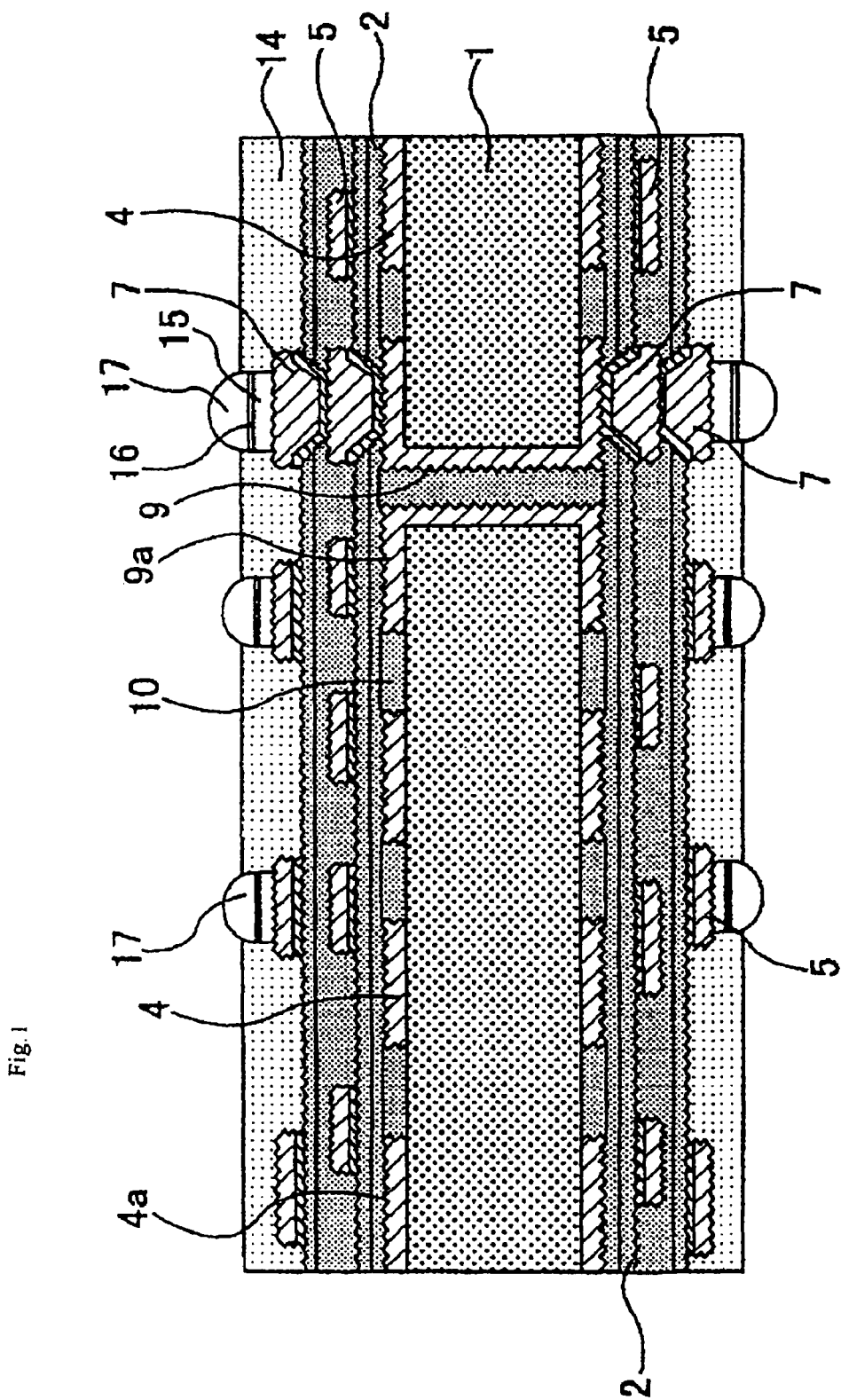
FIG. 1 is a cross-section figure showing one cross-section of a multilayer printed circuit board of the present invention.

| Description of symbols | |
|---|---|
| 1 | a substrate |
| 2a, 2b | a resin complex |
| 2 | a resin insulating layer |
| 4 | an under-level conductor circuit |
| 4a | a roughened surface |
| 5 | an upper layer conductor circuit |
| 6 | an opening part of via-hole |
| 7 | a via-hole |
| 8 | a copper foil |
| 9 | a plated-through hole |
| 9a | a roughened surface |
| 10 | a resin filler |
| 11 | a roughened layer |
| 12 | a Ni—Cu alloy layer |
| 13 | an electroplating layer |
| 14 | a solder resist layer |
| 15 | a nickel plating film |
| 16 | a gold plating film |
| 17 | a solder bump |

DETAILED DESCRIPTION OF THE INVENTION

At first, an electroplating solution of the present invention will be described below.

An electroplating solution of the present invention is an electroplating solution to be employed for manufacturing a multilayer printed circuit board composed of a substrate bearing a conductor circuit and, as serially layered thereon, a resin insulating layer and a conductor circuit in an alternate fashion and in repetition, characterized by containing 50 to 300 g/L of copper sulfate, 30 to 200 g/L of sulfuric acid, 25 to 90 mg/L of chlorine ion, and 1 to 1000 mg/L of an additive containing at least a levelling agent and a brightener.

An electroplating solution of the present invention makes it possible to perfectly fill an opening part of a via-hole and to form a via-hole (hereinafter such a via-hole may be referred as to a filled via) whose upper face and the upper face of a conductor circuit in the same layer are in approximately the same plane in the case where a multilayer printed circuit board is manufactured using the electroplating solution. That is, an electroplating solution of the present invention is optimum for an electroplating solution for a filled via.

The foregoing electroplating solution contains 50 to 300 g/L of copper sulfate, 30 to 200 g/L of sulfuric acid, 25 to 90 mg/L of chlorine ion, and 1 to 1000 mg/L of an additive comprising at least a levelling agent and a brightener.

In the foregoing electroplating solution, if the concentration of copper sulfate is less than 50 g/L, no filled via can be formed and if it exceeds 300 g/L, the dispersion of the plating film thickness becomes wide.

Further, if the concentration of sulfuric acid is less than 30 g/L, the resistance of the solution increases and electroplating becomes hard to take place and if it exceeds 200 g/L, copper sulfate is easily crystallized.

Further, if the concentration of chlorine ion is less than 25 mg/L, the gloss of a plating film is lowered and if it exceeds 90 mg/L, an anode is hardly dissolved.

By using an electroplating solution with such a composition, a filled via can be formed regardless of the opening diameter of the via-hole, the material and the thickness of a resin insulating layer and regardless of execution of the surface roughening of the resin insulating layer.

Further, if the foregoing electroplating solution is used in the case of manufacturing a multilayer printed circuit board, since the electroplating solution contains a high concentration of copper ion, copper ion can sufficiently be supplied to an opening part for a via-hole and the opening part of for a via-hole can be plated at 40 to 100 μm/hr plating speed, thus the speed of the electroplating process can be increased.

Further, since the foregoing electroplating solution contains sulfuric acid in a high concentration, the resistance of the solution can be lowered. The current density is, therefore, increased and the growth of the plating film in an opening part for a via-hole is not inhibited and thus the electroplating solution is suitable for formation of a filled via structure.

The desirable composition of the foregoing electroplating solution is a composition containing 100 to 250 g/L of copper sulfate, 50 to 150 g/L of sulfuric acid, 30 to 70 mg/L of chlorine ion, and 1 to 600 mg/L of an additive containing at least a levelling agent and a brightener.

The foregoing additive is sufficient if it contains at least a levelling agent and a brightener and may contain other components.

At least one substance selected from the group consisting of polyethylene, its derivatives, gelatin, and its derivatives, for example, is preferable to be used as the foregoing levelling agent.

The foregoing polyethylene derivatives are not specifically limited and examples of them are polyethylene isophthalate, polyethylene imine, poly(ethylene oxide), polyethylene glycol, polyethylene glycol ester, polyethylene glycol ether, polyethylene sulfide, polyether and the like.

Among them, polyethylene glycol or gelatin is desirable to be used. That is because they are widely usable and do not damage a resin insulating layer and a metal film.

Further, as the foregoing brightener, for example, at least one compound selected from the group consisting of sulfur oxide, compounds related to sulfur oxide, hydrogen sulfide, compounds related to hydrogen sulfide, and other sulfur compounds is preferable to be used.

The foregoing sulfur oxide and compounds related to the sulfur oxide are not specifically limited, and examples of them are sulfonic acid type compounds, sulfone type compounds, sulfurous acid type compounds, and other sulfur oxide compounds.

The foregoing sulfonic acid compounds are not specifically limited, and examples of them are sulfobenzoic acid, sulfobenzoate, sulfoanthraquinone, sulfomethane, sulfoethane, sulfocarbamide, sulfosuccinic acid, sulfosuccinic acid ester, sulfoacetic acid, sulfosalicylic acid, sulfocyanuric acid, sulfocyanogen, sulfocyanic acid ester, sulfonine, sulfovinic acid, sulfophthalic acid, sulfonic acid amide, sulfonic acid imide and the like, and a sulfocarbonyl type compound such as sulfocarboanilide and the like.

The foregoing sulfone compounds are not specifically limited, and examples of them are sulfonal, sulfonyldiacetic acid, sulfonyldiphenylmethane, sulfoxylic acid, sulfoxylates, sulfonamide, sulfonimide, sulfonyl chloride type compounds and the like.

The foregoing sulfurous acid type compounds are not specifically limited, and examples of them are sulfurous acid, ammonium sulfite, potassium sulfite, diethyl sulfite, dimethyl sulfite, sodium hydrogen sulfite, sulfurous acid ester compounds and the like.

The foregoing other sulfur oxide compounds are not specifically limited, and sulfoxide and the like are examples.

The foregoing hydrogen sulfide and its related compounds are not specifically limited, and examples of them are sulfonium compounds, sulfonium salts and the like.

The foregoing other sulfur compounds are not specifically limited, and bis-disulfide and the like are examples.

An electroplating solution of the present invention is capable of completely filling an opening part of a via-hole with a metal by further containing the foregoing brightener therein and forming the upper face of a via-hole and the upper face of a conductor circuit of the same layer in approximately the same plane by containing the foregoing levelling agent therein in the case of manufacturing multilayer printed circuit board.

That is because the foregoing brightener accelerates plating precipitation on the opening part for a via-hole by activating the low current part of the opening part for a via-hole and also because the foregoing levelling agent suppresses the plating precipitation on the surface of the conductor circuit by being adsorbed on the surface of the conductor circuit.

The addition amount of the foregoing levelling agent is preferably 1 to 1000 mg/L and the addition amount of the foregoing brightener is preferably 0.1 to 100 mg/L. The addition ratio of both is preferably (2:1) to (10:1).

If the addition amount of the foregoing levelling agent is too little, the amount of the levelling agent to be adsorbed on the surface of the conductor circuit is insufficient and it results in acceleration of precipitation on the conductor circuit. On the other hand, if the amount of the levelling agent is too much, the amount of the levelling agent to be adsorbed on the bottom part of the opening part for a via-hole is rather too much and it results in retardation of plating precipitation on the opening part for a via-hole.

Further, if the addition amount of the foregoing brightener is too little, the bottom of the opening part for a via-hole cannot sufficiently activated and therefore complete filling of the opening part for a via-hole with metal cannot be carried out by plating. On the other hand, if the amount is too much, the plating precipitation in the conductor circuit part is accelerated and a step is formed between the upper face of the conductor circuit and the upper face of a via-hole.

An electroplating method using such an electroplating solution is not specifically limited, and the following electroplating methods are applicable.

That is, a general d.c. electroplating method (a DC plating method), a method (a PC plating method) in which electric current is controlled to be rectangular pulsed current by reciprocally repeating cathode current supply and interruption of the current supply, a pulse reverse electroplating method (a PR plating method) in which electric current is controlled by periodically reversed waveforms by repeating reciprocal reverse of cathode current supply and anode current supply, and a method in which high density electric current pulses and low density electric current pulses are reciprocally applied as the cathode current.

Among these methods, the d.c. electroplating method is preferable from a viewpoint that the method is suitable for forming a filled via and that the method does not require a costly electric power source apparatus and control apparatus in the case of manufacturing a multilayer printed circuit board.

Next, a first method for manufacturing a multilayer printed circuit board of the present invention will be described below.

The first method for manufacturing a multilayer printed circuit board of the present invention comprises at least the following processes (a) to (e):

(a) a process of forming a resin insulating layer having an opening part for a via-hole by exposure and development treatment or laser treatment;

(b) a process of forming a metal layer comprising at least one element selected from the group consisting of Cu, Ni, P, Pd, Co and W on the surface of the resin insulating layer and the opening part for a via-hole;

(c) a process of forming a plating resist on the foregoing metal layer;

(d) a process of forming an electroplating film on a part un-coated with the foregoing plating resist using an electroplating solution of the present invention; and (e) a process of forming a conductor circuit by etching the metal layer existing under the foregoing plating resist after the foregoing plating resist is separated.

Hereinafter, the first method for manufacturing a multilayer printed circuit board of the present invention will be descried along the order of the processes.

(1) In the first method for manufacturing a multilayer printed circuit board of the present invention, at first a substrate comprising an insulating substrate and a conductor circuit formed on the surface of the substrate is produced.

As the insulating substrate, a resin substrate is preferable and practically, examples of the substrate are a glass-epoxy substrate, a polyimide substrate, a bismaleimide triazine resin substrate, a fluoro resin substrate, a ceramic substrate, a copper-laminated laminate plate and the like.

In the method for manufacturing a multilayer printed circuit board of the present invention, a through hole is formed in such an insulating substrate by a drill and the like and the wall face of the through hole and a copper foil surface are plated by electroless plating to form a surface conductive film and a plated-through hole. As the electroless plating, a copper plating is preferable.

After the electroless plating, in general, the plated-through hole inner wall and the electroless plating film surface are subjected to surface roughening treatment. Methods applicable to the roughening treatment are, for example, a blackening (oxidizing)-reducing treatment, spraying treatment with an aqueous mixed solution of an organic acid and a cupric complex and a treatment by Cu—NI—P acicular alloy plating and the like.

(2) Next, a conductor circuit is formed by forming an etching resist in a conductor circuit pattern on the substrate already plated by electroless plating and etching the resultant substrate. After that, a resin filler is applied to the substrate surface bearing the conductor circuit, dried to be a half-cured state and then polished to grind the layer of the resin filler and the upper part of the conductor circuit and both main faces of the obtained substrate is leveled. After that, the layer of the resin filler is completely cured.

Incidentally, at the time of forming the layer of the resin filler, by using a mask formed with an opening corresponding to the conductor circuit non forming area, only the conductor circuit non forming area where is formed to be a recessed area by etching may be filled with the resin filler and then the foregoing polishing treatment is carried out.

(3) Next, a roughened layer or a roughened face (hereinafter referred also as to a roughened layer) is formed on the conductor circuit based on necessity. Methods as the roughening treatment method are, for example, blackening (oxidizing)-reducing treatment, spraying treatment with an aqueous mixed solution of an organic acid and a cupric complex and a treatment by Cu—NI—P acicular alloy plating and the like.

(4) Next, based on necessity, a coating layer of tin, zinc, copper, nickel, cobalt, thallium, lead and the like is formed on the formed roughened surface by electroless plating or vapor deposition. That is because the conductor circuit exposed out from the resin insulating layer can be protected from a roughening solution and an etching solution by precipitating the foregoing coating layer in a thickness of 0.01 to 2 µm. Hence tarnishment and dissolution of an inner layer pattern can reliably be prevented (5) After that, an un-cured resin layer which is going to be a resin insulating layer by the following treatment is formed on the conductor circuit on which the roughened layer is formed.

Applicable as a material of the foregoing resin insulating layer are a thermosetting resin, a thermoplastic resin, a partially photosensitized thermosetting resin, and composite resin thereof.

The foregoing un-cured resin layer may be formed by applying an un-cured resin or by thermally laminating an un-cured resin film. A resin film, which is an un-cured resin film bearing a metal layer of such as a copper foil in one face may be stuck on as well. In the case of using such a resin film, the metal layer corresponding to a via-hole formation part is etched and then an opening part is formed by radiating laser beam. As the resin film bearing a metal layer, a copper-laminated resin can be used.

Among those materials of the resin insulating layer, a polyolefin type resin, a polyphenylene type resin (PPE, PPO and the like), and a fluoro resin are preferable since they are suitable for forming a resin insulating layer with a low dielectric constant.

Examples of the foregoing polyolefin resin are above mentioned polyethylene, polypropylene, polyisobutylene, polybutadiene, polyisoprene, 2-norbornane, 5-ethylidene-2-norbornane, and copolymers of these resins and examples of the foregoing fluoro resin are ethyl/tetrafluoroethylene copolymer resin (ETFE), poly(chlorotrifluoroethylene) (PCTFE) and the like.

Further, also applicable as a material of the foregoing resin insulating layer is a composite resin of the foregoing thermosetting resin and a thermoplastic resin.

Examples of the foregoing thermoplastic resin are polysulfone (PSF), polyether sulfone (PES), polyphenylene sulfone (PPS), polyphenylene sulfide (PPES), polyphenylene ether (PPE), polyether imide (PI), a phenoxy resin, a fluoro resin and the like.

Among them, preferable ones are polysulfone (PSF), polyether sulfone (PES), polyether imide (PI), and/or a phenoxy resin. That is because they are particularly suitable to form a resin insulating layer excellent in cracking resistance, shape retaining property owing to high heat resistance, excellent insulating property and high toughness value.

Examples of the foregoing thermosetting resin are an epoxy resin, a phenol resin, a polyimide resin and the like. Further, the foregoing thermosetting resin may be a photo-sensitized one and practically, those produced by acrylation reaction of methacrylic acid or acrylic acid with a thermosetting group can be exemplified. Acrylated epoxy resins are particularly preferable. Among them, an epoxy resin having 2 or more epoxy groups in one molecule is especially desirable.

Examples of the foregoing epoxy resin are a cresol novolak type epoxy resin, a bisphenol A-type epoxy resin, a bisphenol F-type epoxy resin, a phenol novolak type epoxy resin, an alkylphenol novolak type epoxy resin, a biphenol F type epoxy resin, a naphthalene type epoxy resin, a dicyclopentadiene type epoxy resin, an epoxylated condensate of a phenol and an aromatic aldehyde having a phenolic hydroxyl group, triglycidyl isocyanurate, and an alicyclic epoxy resin. They may be used solely or in combination of two or more of them. Consequently, excellent heat resistance can be provided.

The mixing ratio of a thermoplastic resin and a thermosetting resin in the foregoing resin composite is preferably 95/5 to 50/50=the thermosetting resin/the thermoplastic resin. That is because a high toughness value can be retained without deteriorating the heat resistance.

Further, the foregoing resin composite may be a photosensitive resin provided with photosensitivity. In the case where a photosensitive resin is used, an opening part for a via-hole can be formed by exposure and development treatment.

A concrete example of the foregoing resin composite is a resin composition for roughened surface formation containing particles soluble in an acid or an oxidizing agent (hereinafter, referred as to soluble particles) being dispersed in a resin hardly soluble in an acid or an oxidizing agent (hereinafter, referred as to a hardly soluble resin) and the like.

Incidentally, regarding the terms, hardly soluble and soluble, those with relatively high dissolution rates are to be called soluble and those with relatively low dissolution rates are to be called hardly soluble for the sake of convenience in the case where resins are immersed in the same roughening solution for the same duration.

Examples of the foregoing soluble particle are a resin particle soluble in an acid or an oxidizing agent (hereinafter referred as to a soluble resin particle), an inorganic particle soluble in an acid or an oxidizing agent (hereinafter, referred as to a soluble inorganic particle), and a metal particle soluble in an acid or an oxidizing agent (hereinafter, referred as to a soluble metal particle). These soluble particles may be used solely or in combination of two or more of them.

The shape of the foregoing soluble particle is not specifically limited, and may be spherical and crushed state. Addition to that, the shape of the foregoing soluble particle is preferably evenly shaped. That is because a roughened surface with uniform roughness can be formed.

The average particle size of the foregoing soluble particle is preferably 0.1 to 10 µm. Two or more kinds of particles with different particle sizes may be used if their particle sizes are within the range. That is, a soluble particle with the average particle size of 0.1 to 0.5 µm and a soluble particle with the average particle size of 1 to 3 µm may be contained together. Consequently, further complicated roughened face can be formed and a high adhesion strength to a conductor circuit can be achieved. Incidentally, in this specification, the particle size of a soluble particle means the length of the longest part of the soluble particle.

The foregoing soluble resin particle is not specifically limited unless the resin particle has a higher dissolution rate than that of the foregoing hardly soluble resin in the case where the particle is immersed in an acid or an oxidizing agent and its concrete examples are an epoxy resin, a phenol resin, a polyimide resin, a polyphenylene resin, a polyolefin resin, a fluoro resin, an amino resin (a melamine resin, an urea resin, a guanamine resin) and the like and may be used solely or a mixture of two or more of them.

Those preferable to be used as the soluble resin particle are (a) a soluble resin powder with the average particle size of 10 μm or smaller, (b) an agglomerated particle produced by agglomeration of a soluble resin powder with the average particle size of 2 μm or smaller, (c) a mixture of a soluble resin powder with the average particle size of 2 to 10 μm and a soluble resin powder with the average particle size of 2 μm or smaller, (d) a pseudo particle produced by stacking a soluble resin powder and/or an inorganic powder, the average particle size of those are 2 μm or smaller, to the surface of a soluble resin powder with the average particle size of 2 to 10 μm, (e) a mixture of a soluble resin powder with the average particle size of 0.1 to 0.8 μm and a soluble resin powder with the average particle size larger than 0.8 μm and smaller than 2 μm, and (f) a soluble resin powder with the average particle size of 0.1 to 1.0 μm. Because they can form more complicated anchors.

Further, as the soluble resin particle, a resin particle of rubber can be used. Examples of the foregoing rubber is polybutadiene rubber, variously modified polybutadiene rubber such as an epoxy-modified one, an urethane-modified one, (meth)acrylonitrile-modified one and the like, and (meth)acrylonitrile-butadiene rubber containing carboxyl group. By using such rubber, the soluble resin particle is made easy to be dissolved in an acid or an oxidizing agent. In other words, in the case of dissolving a soluble resin particle in an acid, the particle can be dissolved in an acid other than a strong acid and in the case of dissolving a soluble resin particle in an oxidizing agent, the particle can be dissolved even in permanganic acid with a relatively weak oxidative capability. Further in the case of dissolving in chromic acid, the dissolution can be carried out in a low concentration. For that, neither an acid nor an oxidizing agent remain on the surface of the resin and as it will be described somewhere later, so that such a case where no catalyst is provided or where a catalyst is oxidized at the time when a catalyst such as a palladium chloride is supplied after the roughened surface formation can be avoided.

Examples of the foregoing soluble inorganic particles are particles of one or more substances selected from the group consisting of an aluminum compound, a calcium compound, a potassium compound, a magnesium compound, and a silicon compound.

Examples of the foregoing aluminum compound are alumina and aluminum hydroxide, examples of the foregoing calcium compound are calcium carbonate, calcium hydroxide, an example of the foregoing potassium compound is potassium carbonate, examples of the foregoing magnesium compound are magnesia, dolomite, basic magnesium carbonate, and examples of the foregoing silicon compound are silica and a zeolite. They may be used solely or in combination of two or more of them.

Examples of the foregoing soluble metal particle are particles of one or more metals selected from the group consisting of copper, nickel, iron, zinc, lead, gold, silver, aluminum, magnesium, calcium, and silicon. Further, in order to keep insulating property, these soluble metal particles may be coated with resin in the surface.

In the case of using two or more of these soluble particles are used as a mixture, the combination of the two types of soluble particles is preferably a combination of a resin particle and an inorganic particle. That is because, owing to low conductivity of both, the insulating property between upper and lower conductor circuits can reliably be retained and the thermal expansion in relation to an hardly soluble resin is easy to be controlled and no crack is formed in a resin insulating layer and no separation occurs between the resin insulating layer and the conductor circuit.

As the foregoing hardly soluble resin, those applicable are any resin which can maintain the roughened surface shape at the time of forming a roughened surface on a resin insulating layer using an acid or an oxidizing agent and a mixture of the foregoing thermoplastic resin and the foregoing thermosetting resin may be used.

In the case where a resin composition for roughened surface formation is used for the foregoing resin composite, the foregoing soluble particle is preferable to be approximately evenly dispersed in the foregoing hardly soluble resin. That is because a roughened surface with uniform roughness can be formed and high adhesion to a conductor circuit including a via-hole can reliably be formed.

Further, a film containing a soluble particle may be used only for the surface layer part to form a roughened surface thereon. In this case, since any parts except the surface layer part of the film are protected from exposure to an acid or an oxidizing agent, the insulating property of conductor circuits having a resin insulating layer between them can reliably be maintained.

The mixing ratio by weight of the foregoing soluble particle is preferably 5 to 50 wt. % to the solid content of the hardly soluble resin and further preferably 10 to 40 wt. %.

If the mixing weight ratio of the soluble resin is less than 5 wt. %. a roughened surface with the sufficient roughness cannot sometimes be formed and in the case of exceeding 50 wt. %, the insulating property between upper and lower conductor circuits having a resin insulating layer between them cannot sufficiently be maintained and it sometimes results in occurrence of short circuit since dissolution of the resin insulating layer reaches even in deeper part at the time of roughened surface formation by dissolving the soluble resin particle with an acid or an oxidizing agent.

The foregoing resin composition for roughened surface formation is preferable to contain a hardening agent and other components other than the foregoing thermoplastic resin and the foregoing thermosetting resin.

Examples of the foregoing hardening agent are an imidazole type hardening agent, an amine type hardening agent, a guanidine type hardening agent, epoxy adducts of these hardening agents, microcapsulated ones of these hardening agents, and an organic phosphine type compound such as triphenylphosphine, tetraphenylphosphonium tetraphenyl borate, and the like.

The content of the foregoing hardening agent is preferably 0.05 to 10 wt. % to a resin composition for roughened surface formation. If less than 0.05 wt. %, the resin composite is not sufficiently cured at the time of forming a resin insulating layer and the degree of penetration of a resin film with an acid becomes high at the time of forming a roughened surface on the resin insulating layer using an acid or an oxidizing agent and it sometimes results in deterioration of the insulating property of the resin insulating layer. On the other hand, if the content exceeds 10 wt. %, the excess hardening agent component sometimes denatures the resin composition, resulting in decrease of the reliability.

The foregoing other components include fillers of inorganic compounds and resins which do not affect the formation of a roughened surface.

Examples of the inorganic compounds are silica, alumina, dolomite and the like and examples of the resin are a polyimide resin, a polyacrylic resin, a polyamideimide resin, a polyphenylene resin, a melamine resin, an olefin type resin and the like. By adding such a filler, conformation of the thermal expansion coefficient and the heat resistance and the chemical resistance can be improved and the properties of a multilayer printed circuit board can further be improved.

Further, the foregoing resin composition for roughened surface formation may contain a solvent. Examples of the foregoing solvent are ketones such as acetone, methyl ethyl ketone, and cyclohexanone and aromatic hydrocarbons such as ethyl acetate, butyl acetate, cellosolve acetate, toluene, xylene and the like. They may be used solely or in combination of two or more of them.

By forming a resin insulating layer using the foregoing resin composite, a roughened surface can easily be formed on the resin insulating layer and further at the time when a plating layer is formed on the resin insulating layer bearing the roughened surface thereon by employing an electroplating solution of the present invention, stress generated in the plating layer is not so high and the stress is moderated, so that no crack and no separation are caused in the resin insulating layer. Especially, preferable effects are obtained in the peripheral part of a filled via.

(6) Next, a resin insulating layer having an opening part for a via-hole is formed by exposure and development treatment or laser treatment.

The formation of the opening part of the via-hole is carried out using laser beam and oxygen plasma in the case where the resin matrix of the resin composite is a thermosetting resin, a polyolefin type resin, and a cycloolefin type resin. In the case where the resin matrix is a photosensitive resin, the formation is carried out by exposure and development treatment or laser treatment. The exposure and development treatment is carried out before the hardening of a not-yet-cured photosensitive resin layer. The foregoing laser treatment may be carried out regardlessly before or after the thermal hardening or the photo hardening.

Further, the exposure and development treatment is carried out by closely setting a photomask (a glass substrate is preferable) drawing a circular pattern for opening part formation for a via-hole on a photosensitive resin insulating layer in the state that the circular pattern side is kept on the resin layer side, exposing the resultant resin insulating layer, and either immersing the resin insulating layer in a development solution or spraying the solution to the resin insulating layer.

By hardening the uncured resin insulating layer formed on a conductor circuit having a sufficiently roughened face, an resin insulating layer with a high adhesion strength to the conductor circuit can be formed.

In the case of forming an opening part for a via-hole by using the foregoing laser beam, the laser beam to be employed is carbon dioxide ($CO_2$) laser, UV laser, excimer laser, YAG laser and the like. Among them, preferable are excimer laser and carbon dioxide gas laser in short pulses.

This is because; the excimer laser, as described later, is capable of forming a large number of the opening part for the via-hole at one time by using a mask formed with the through hole in the parts corresponding to the positions for forming the opening part for the via-hole and the short pulsed carbon dioxide gas laser scarcely leaves resin residues in opening parts and slightly damages the resin in the peripheral parts of opening parts.

Further, a hologram-method excimer laser as the excimer laser is preferable to be employed. The hologram way means the a manner for radiating laser beam to an object matter through hologram, a condenser, a laser mask, a transfer lens and the like and by employing this manner, a large number of opening parts are efficiently formed one time radiation.

In the case of employing carbon dioxide gas laser, the pulse intervals are preferably $10^{-4}$ to $10^{-8}$ second. Further, the duration of the laser radiation for forming an opening part is preferably 10 to 500 μsecond.

In the case of employing excimer laser, the through hole of a mask formed with the a through hole in the part corresponding to the position of the part to form the opening part for the via-hole are required to be in a true circular shape in order to make the spot shape of the laser beam true circular, and the diameter of the foregoing through hole is preferably around 0.1 to 2 mm.

In the case of forming an opening part by laser beam, especially by using carbon dioxide gas laser, de-smearing treatment is preferably to be carried out. The foregoing de-smearing treatment can be carried out using an oxidizing agent of an aqueous solution of chromic acid or a permanganic acid salt. Further, the treatment may be carried out using oxygen plasma, plasma of a mixture of $CF_4$ and oxygen, corona discharge and the like. Further the surface may be modified by radiating UV rays using a low pressure mercury lamp.

(7) Next, the surface roughening is carried out for a resin insulating layer on which an opening part for a via-hole is formed based on the necessity. In the case a resin composition for roughened surface formation is used as a material for the resin insulating layer, the roughening treatment is, for example, carried out by dissolving and removing a soluble resin particle existing on the surface of the resin insulating layer with an acid or an oxidizing agent.

The height of the roughened surface to be formed by acid treatment and the like preferably satisfies the condition of Rmax=0.01 to 20 μm. That is in order to assure a high adhesion strength to a conductor circuit. Especially, in the case of a semi-additive method, the height is preferably 0.1 to 5 μm. Because a metal layer can be removed while keeping high adhesion property.

In the case of carrying out such acid treatment, phosphoric acid, hydrochloric acid, sulfuric acid, or an organic acid such as formic acid and acetic acid may be used and especially an organic acid is preferable to be used because these hardly cause corrosion of a metal conductor layer exposed out a via-hole in the case of forming a roughened surface.

The foregoing oxidation treatment, chromic acid and a permanganic acid salt (potassium permanganate) is preferably used.

(8) Next, a thin metal layer of at least one element selected from the group consisting of Cu, Ni, P, Pd, Co and W is formed on the surface of a resin insulating layer and an opening part for a via-hole.

The thickness of a metal layer is preferably 0.1 to 5 μm and further preferably 0.5 to 2 μm. The foregoing metal layer is preferably formed by sputtering, plating, or in combination of sputtering with plating.

(9) Next, a plating resist is formed on the metal layer formed by the foregoing process (8).

As the foregoing plating resist, a photosensitive dry film and a liquid state resist sold on the market may be used.

Further, the foregoing resist can be formed by sticking a photosensitive dry film or applying a liquid state resist and then carrying out exposure with UV rays and development with an aqueous alkaline solution.

(10) Next, using an electroplating solution of the present invention, an electroplating film is formed on parts un-coated with the resist formed by the process (9). That is performed by immersing a substrate bearing the foregoing metal layer and plating resist formed thereon in the foregoing electroplating solution. As a levelling agent to be contained to the foregoing electroplating solution, it is preferable to use one or more substances selected from the group consisting of polyethylene, its derivatives, gelatin and its derivatives and as the brightener to be contained to the foregoing electroplating solution, it is preferable to use one or more compounds selected from the group consisting of sulfur oxide, compounds related to it, hydrogen sulfide, compounds related to it, and other sulfur compounds.

As the electroplating, an electrolytic copper plating is preferable and the thickness is preferable 3 to 25 µm in the conductor circuit parts except a via-hole. If the thickness is thinner than 3 µm, the upper face of a via-hole and the upper face of a conductor circuit in the same layer are sometimes not conformed to each other in approximately the same plane, and if a conductor circuit with a thickness exceeding 25 µm is tried to be formed, the thickness of the plating resist is made thick and it sometimes occurs that the electroplating solution hardly penetrates the parts where no plating resist is formed. The thickness is further preferably 5 to 15 µm. Further, the distance between the bottom face of a formed via-hole to the upper face is preferably 2 to 7 times as long as the thickness of the foregoing conductor circuit part.

As a method for the foregoing electroplating is not specifically limited, and as described above, a d.c. electroplating method is preferable to be employed.

(11) Next, after the foregoing plating resist is parted by an aqueous strongly alkaline solution and then the metal layer existing beneath is etched. Thus, an upper layer conductor circuit and a via-hole are independently patterned.

Methods applicable to the foregoing etching may be chemical etching using an aqueous sulfuric acid/hydrogen peroxide solution, an aqueous solution of ferric chloride, cupric chloride, and persulfates such as ammonium persulfate and physical etching such as ion beam etching.

Palladium catalyst nuclei exposed in the parts other than conductor circuit parts are removed by being dissolved by chromic acid, sulfuric acid, hydrogen peroxide and the like.

(12) If necessary, the processes (3) to (11) are repeated and electroless plating or etching is carried out for a conductor circuit in the uppermost layer in the same conditions as those of the foregoing process (3) to form a roughened layer or a roughened face on the conductor circuit in the uppermost layer.

Next, a solder resist layer is formed on the substrate surface including the conductor circuit in the uppermost layer. As the foregoing solder resist layer, examples are a polyphenylene ether resin, a polyolefin resin, a fluoro resin, a thermoplastic elastomer, a solder resist resin composition and the like.

The foregoing solder resist layer is formed by applying an un-cured resin (a resin composition) by a roll coater method and then carrying out the above described opening treatment and the hardening treatment.

Examples of the foregoing solder resist resin composition are a thermosetting resin containing a novolak type epoxy resin (meth)acrylate, an imidazole curing agent, bifunctional (meth)acrylic acid ester monomer, a polymer of (meth)acrylic aid ester with 500 to 5000 molecular weight and bisphenol type ester resins, and a paste type fluid containing a photosensitive monomer of such as a polyvalent acrylic monomer and a glycol ether type solvent and the viscosity is preferably adjusted to be 1 to 10 Pa·s at 25° C.

Examples of the foregoing novolak type epoxy resin (meth)acrylate are epoxy resins produced by reaction of acrylic acid or methacrylic acid with glycidyl ether of phenol novolak or cresol novolak.

The foregoing bifunctional (meth)acrylic acid ester monomer is not specifically limited, and esters of acrylic acid and methacrylic acid with various kinds of diols are example.

After that, a solder bump is formed in the opening part in the foregoing solder resist layer to complete the manufacturing processes of a multilayer printed circuit board of the present invention.

In addition to that, a letter printing process for forming product-identifying letters and oxygen or tetrachloromethane plasma treatment may properly be carried out for the sake of modifying the solder resist layer when necessary.

FIG. 1 is a cross-section figure of one cross-section of a multilayer printed circuit board of the present invention and the first method for manufacturing the multilayer printed circuit board of the present invention is capable of manufacturing a printed circuit board in which, as being shown in FIG. 1, an opening part for a via-hole is completely filled with a metal and the upper face of a via-hole 7 and the upper face of a conductor circuit 4, 5 in the same layer are in approximately the same plane and further is capable of manufacturing a printed circuit board having a stack via structure. Incidentally, the stack via structure is a structure having a via-hole 7 and an another via-hole 7 immediate above the via-hole 7 in an upper layer.

Next, a method for manufacturing a multilayer printed circuit board according to the second method of the present invention will be described.

The second method for manufacturing a multilayer printed circuit board of the present invention comprises at least the following processes (a) to (d):

(a) a process of forming a resin insulating layer having an opening part for a via-hole by exposure and development treatment or laser treatment;

(b) a process of forming a metal layer comprising at least one element selected from the group consisting of Cu, Ni, P, Pd, Co and W on the surface of the resin insulating layer and the opening part for a via-hole;

(c) a process of forming an electroplating film on the metal layer using an electroplating solution of the present invention; and (d) a process of forming a conductor circuit by etching after an etching resist is formed on the foregoing electroplating film.

Hereinafter, the second method for manufacturing a multilayer printed circuit board of the present invention will be descried along the order of the processes.

Incidentally, the foregoing second method for manufacturing a multilayer printed circuit board of the present invention only differs from the foregoing the first method for manufacturing a multilayer printed circuit board of the present invention in the foregoing processes (c) and (d) and other than these processes (c) and (d), the same method as the first method of the present invention for manufacturing a multilayer printed circuit board may be employed to perform the method. Consequently, here, mainly the processes (c) and (d) of the foregoing second method for manufacturing a multilayer printed circuit board of the present invention will be described.

(1) At first, a thin metal layer is formed on the foregoing insulating layer and opening part of a via-hole in the same manner as those of the processes (1) to (8) of the method for manufacturing a multilayer printed circuit board according to the first method of the present invention.

(2) Following that, using an electroplating solution of the present invention, an electroplating film is formed on the metal layer formed in the process (1). It is performed by immersing a resultant substrate bearing the foregoing metal layer formed thereon in the foregoing electroplating solution.

Additionally, as a levelling agent to be contained to the foregoing electroplating solution, at least one substance selected from the group consisting of polyethylene, its derivatives, gelatin, and its derivatives is preferable to be used and as a brightener to be contained to the foregoing electroplating solution, at least one compound selected from the group consisting of sulfur oxide, compounds related to sulfur oxide, hydrogen sulfide, compounds related to hydrogen sulfide, and other sulfur compounds is preferable to be used.

As the electroplating, an electrolytic copper plating is preferable and the thickness is preferably 3 to 25 μm in the conductor circuit parts except a via-hole. If the thickness is thinner than 3 μm, the upper face of a via-hole and the upper face of a conductor circuit in the same layer are sometimes not conformed to each other in approximately the same plane and disconnection of a conductor circuit sometimes takes place, and if the thickness exceeds 25 μm, an electroplating layer and a metal layer are sometimes not completely removed at the time of etching. The thickness is further preferably 5 to 15 μm. Also, the distance between the bottom face of a formed via-hole to the upper face is preferably 2 to 7 times as long as the thickness of the foregoing conductor circuit part.

Although the foregoing electroplating method is not specifically limited, as described above, ad.c. electroplating method is preferable to be employed.

(3) Further, after an etching resist is formed on the electroplating film, etching is carried out to form a conductor circuit.

As the foregoing etching resist, a photosensitive dry film and a liquid state resist sold on the market may be used.

Further, after a photosensitive dry film is stuck or a liquid state resist is applied, exposure with UV rays and development with an aqueous alkaline solution are carried out.

(4) Next, a metal layer and an electroplating layer corresponding to the conductor circuit non forming area are removed by etching and then the etching resist is parted by an aqueous strong alkaline solution to form independently patterned an upper layer conductor circuit and a via-hole.

Methods applicable to the foregoing etching may be chemical etching using an aqueous sulfuric acid/hydrogen peroxide solution, an aqueous solution of ferric chloride, cupric chloride, and persulfates such as ammonium persulfate and physical etching such as ion beam etching.

Palladium catalyst nuclei exposed in the parts other than conductor circuit parts are removed by being dissolved by chromic acid, sulfuric acid, hydrogen peroxide and the like.

(5) Further, based on the necessity, as same in the method for manufacturing a multilayer printed circuit board according to the first method of the present invention, processes from the process of forming a roughened layer on the conductor circuit surface to the process (the foregoing process (4)) of forming the conductor circuit are repeated and after that, a roughened layer or a roughened face on the conductor circuit is formed in the uppermost layer.

Next, as same in the first method for manufacturing a multilayer printed circuit board of the present invention, a solder resist layer is formed and after that, a solder bump is formed in the opening part in the foregoing solder resist layer to complete the multilayer printed circuit board manufacturing according to the second method for manufacturing a multilayer printed circuit board of the present invention.

Next, a multilayer printed circuit board of the present invention will be described.

A multilayer printed circuit board of the present invention is a multilayer printed circuit board comprising a substrate bearing a conductor circuit and, as serially layered thereon, a resin insulating layer and a conductor circuit in an alternate fashion and in repetition, wherein the conductor circuits neighboring in up and down direction are connected through a via-hole, characterized in that the foregoing via-hole is filled with a metal, that the upper face of a via-hole and the upper face of a conductor circuit in the same layer are kept approximately in the same plane and that the distance from the bottom face to the upper face of the foregoing via-hole is about 2 to 7 times as long as the thickness of the foregoing conductor circuit.

In a multilayer printed circuit board of the present invention, since the opening part for a via-hole is completely filled with a metal and the upper face of the foregoing via-hole and the upper face of the foregoing conductor circuit in the same layer are approximately in the same plane, no separation or no crack occurs between a conductor circuit including a via-hole and a resin insulating layer and also disconnection of a conductor circuit in the upper layer of the conductor circuit does not take place. Further, the foregoing multilayer printed circuit board can be provided with a stack via structure with which the wiring distance is shortened in order to provide a printed circuit board with a high speed and fine structure.

As a multilayer printed circuit board of the present invention, those with the structure illustrated in FIG. 1 are examples.

In a multilayer printed circuit board of the present invention, the distance from the bottom face to the upper face of a via-hole is 2 to 7 times as long as the thickness of the conductor circuit.

In the case of a printed circuit board comprising a conductor circuit having the distance from the bottom face to the upper face of a via-hole exceeding 7 times as long as the thickness of the conductor circuit, the opening part for the via-hole is difficult to be completely filled with a metal and therefore the upper face of the via-hole and the upper face of the conductor circuit in the same layer cannot sometime be approximately in the same plane to make it difficult to form a stack via structure. On the other hand the shallower the depth of an opening part of a via-hole is, the easier the filled via structure is formed, however in the case of a printed circuit board comprising a conductor circuit having the distance from the bottom face to the upper face of the via-hole less than 2 times as long as the thickness of the conductor circuit, the upper face of the via-hole sometimes becomes higher than the upper face of the conductor circuit and disconnection of the conductor circuit sometimes takes place.

A resin insulating layer of the foregoing multilayer printed circuit board is preferable to have a dielectric constant of 3.0 or lower at 1 GHz.

By using a resin insulating layer with a dielectric constant of 3.0 or lower, delay and errors related to the electron signals can be prevented even in the case the multilayer printed circuit board is used in a high frequency band of 1 GHz or higher.

Resins to be used for the foregoing resin insulating layer may be the same resins as those used in the first or the second method for manufacturing a multilayer printed circuit board of the present invention.

Such a multilayer printed circuit board of the present invention is preferable to be manufactured by the first or second method for manufacturing a multilayer printed circuit board of the present invention.

BEST MODE FOR CARRYING OUT THE INVENTION

Hereinafter, the present invention will be described in detail along with examples.

EXAMPLE 1

A. Preparation of a Resin Composite (an Adhesive for an Upper Layer)

(i) A mixture composition was produced by blending 35 parts by weight of a resin solution produced by dissolving 80 wt. % of a cresol novolak type epoxy resin acrylated in 25% (made by Nippon Kayaku Co., Ltd.: molecular weight 2,500) in diethylene glycol dimethyl ether (DMDG), 3.15 parts by weight of a photosensitive monomer (made by Toagosei Chemical Industry Co., Ltd.: Aronix M 315), 0.5 parts by weight of a defoaming agent (made by San Nopco Ltd.: S-65), and 3.6 parts by weight of N-methylpyrrolidone (NMP) in a container and mixing and stirring them.

(ii) Another mixture composition was produced by blending 12 parts by weight of polyether sulfone (PES), 7.2 parts by weight of an epoxy resin particle (made by Sanyo Chemical Industries, Ltd.: Polymerpol) with the average particle size of 1.0 µm and 3.09 parts by weight of the particle with the average particle size of 0.5 µm in another container and mixing and stirring the mixture and then further adding 30 parts by weight of NMP and mixing and stirring the resultant mixture by a bead mill.

(iii) A mixture composition was produced by blending 2 parts by weight of an imidazole curing agent (made by Shikoku Chemicals Corp.: 2E4MZ-CN), 2 parts by weight of a photopolymerization initiator (made by Chiba Speciality Chemicals Corp.: Irgacure I-907), 0.2 parts by weight of a photosensitizer (made by Nippon Kayaku Co., Ltd.: DETX-S) and 1.5 parts by weight of NMP in further another container and mixing and stirring the mixture.

A resin composite was produced by mixing the mixture compositions produced as (i), (ii) and (iii).

B. Preparation of a Resin Composite (an Adhesive for an Underlayer)

(i) A mixture composition was produced by blending 35 parts by weight of a resin solution produced by dissolving 80 wt. % of a cresol novolak type epoxy resin acrylated in 25% (made by Nippon Kayaku Co., Ltd.: molecular weight 2,500) in diethylene glycol dimethyl ether (DMDG), 4 parts by weight of a photosensitive monomer (made by Toagosei Chemical Industry Co., Ltd.: Aronix M 315), 0.5 parts by weight of a defoaming agent (made by San Nopco Ltd.: S-65), and 3.6 parts by weight of N-methylpyrrolidone (NMP) in a container and mixing and stirring them.

(ii) Another mixture composition was produced by blending 12 parts by weight of polyether sulfone (PES) and 14.49 parts by weight of an epoxy resin particle (made by Sanyo Chemical Industries, Ltd.: Polymerpol) with the average particle size of 0.5 in another container, mixing and stirring the mixture, and then further adding 30 parts by weight of NMP and mixing and stirring the resultant mixture by a bead mill.

(iii) A mixture composition was produced by blending 2 parts by weight of an imidazole curing agent (made by Shikoku Chemicals Corp.: 2E4MZ-CN, 2 parts by weight of a photopolymerization initiator (made by Chiba Speciality Chemicals Corp.: Irgacure I-907), 0.2 parts by weight of a photosensitizer (made by Nippon Kayaku Co., Ltd.: DETX-S) and 1.5 parts by weight of NMP in further another container and mixing and stirring the mixture.

A resin composite was produced by mixing the mixture compositions produced as (i), (ii) and (iii).

C. Preparation of a Resin Filler (i) A resin filler with the viscosity of 40 to 50 Pa·s at 23±1° C. was produced by blending 100 parts by weight of a bisphenol F type epoxy monomer (made by Yuka Shell Epoxy Co.: molecular weight 310: YL 983U), 170 parts by weight of a $SiO_2$ spherical particle (made by Admatechs Co., Ltd.: CRS1101-CE) coated with a silane coupling agent on the surface and having the average particle size of 1.6 µm and the diameter of the maximum particle of 15 µm or smaller and 1.5 parts by weight of a levelling agent (made by San Nopco Ltd.: Perenol S4) in a container and mixing and stirring the mixture.

Incidentally, 6.5 parts by weight of an imidazole curing agent (made by Shikoku Chemicals Corp.: 2E4MZ-CN) was used as a curing agent.

D. A Method for Manufacturing a Printed Circuit Board (1) A copper-laminated laminate plate composed of a substrate 1 which is made of a 1 mm-thick glass epoxy resin or BT (bismaleimide triazine) resin with a 18 µm-thick copper foil 8 laminated on both sides of the substrate 1 was used as a starting material (reference to FIG. 2 (a)). At first, the copper-laminated laminate plate was drilled to form a through hole, subjected to electroless plating treatment and then etching treatment in a pattern to form an under-level conductor circuit 4 in both sides of the substrate 1 and a plated-through hole 9.

(2) After the resultant substrate in which the plated-through hole 9 and the under-level conductor circuits 4 are formed was washed with water and dried, the substrate was blackened in a blackening bath (an oxidizing bath) containing an aqueous solution containing NaOH (10 g/L), $NaClO_2$ (40 g/L) and $Na_3PO_4$ (6 g/L) and reduced in a reducing bath containing NaOH (10 g/L) an $NaBH_4$ (6 g/L) to form roughened faces 4a, 9a in the entire surfaces of the under-level conductor circuits 4 including the plated-through hole 9 (reference to FIG. 2(b)).

(3) After the resin filler described in the foregoing C was produced, a layer of the resin filler 10 was formed, by a method described below, in the inside of the plated-through hole 9 and the parts where no conductor circuit was formed on one side of the substrate 1 and the outer peripheries of the conductor circuits 4 within 24 hours after the preparation.

That is, after the resin filler was squeezed in the plated-through hole by a squeegee, the filler was dried at 100° C. for 20 minutes. Then, a mask drawing openings in parts corresponding to the conductor circuit non forming area was put on a substrate and a layer of the resin filler 10 was formed in the recessed parts which is the conductor circuit non forming area by using a squeegee and dried at 100° C. for 20 minutes (reference to FIG. 2(c)).

(4) One side of the resultant substrate already subjected to the above described treatment (3) was subjected to polishing to polish the layer of the resin filler 10 formed in the outer peripheries of the conductor circuits and the upper part of the resin filler 10 formed in the conductor circuit non forming area by a belt sander polishing using #600 belt polishing paper (made by Sankyo Chemical Engneering Co.) and then subjected to buffing to remove the scars formed by the foregoing belt sander polishing. A series of such polishing steps were carried out for the other side in the same manner.

Incidentally, if necessary, etching might be carried out before and after the polishing to level a land 9a of the though hole 9 and the roughened faces 4a formed in the under-level conductor circuits 4.

After that, heating treatment at 100° C. for 1 hour and successively at 150° C. for 1 hour was carried out to completely harden the layer of the resin filler.

Figure 2:
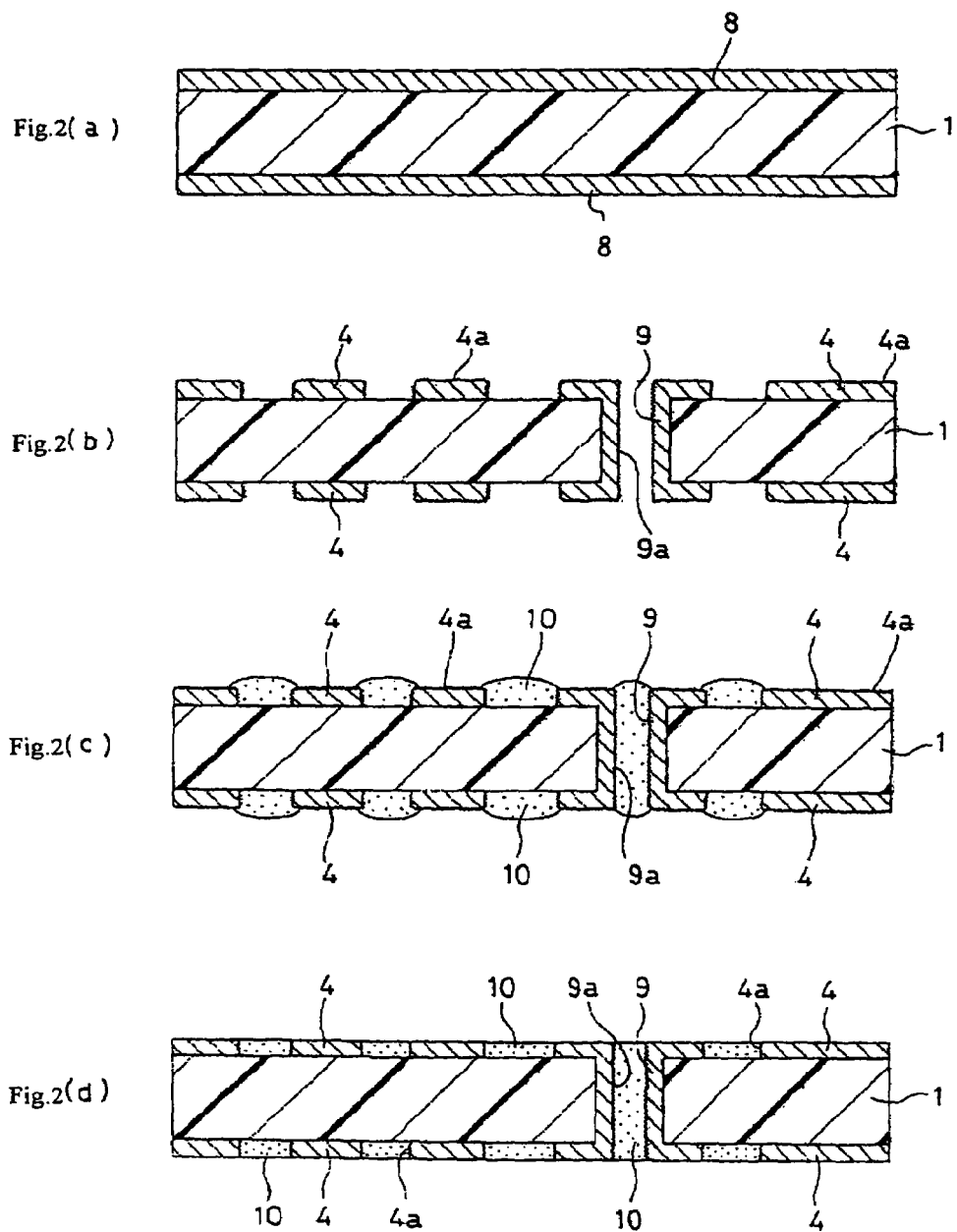
FIGS. 2 (a) to (d) are cross-section figures showing a part of processes of manufacturing a multilayer printed circuit board of the present invention.

In such a way, the surface layer part of the resin filler 10 formed in the plated-through hole 9 and in the conductor circuit non forming area and the surfaces of the under-level conductor circuits 4 were leveled to obtain an insulating substrate where the resin filler 10 and the side faces 4a of the under-level conductor circuits 4 were firmly stuck to each other through the roughened faces and the inner wall face 9 of the plated-through hole 9 and the resin filler 10 were firmly stuck to each other through the roughened faces (reference to FIG. 2 (d)). That is, through the processes, the surface of the resin filler and the surface of an inner layer copper pattern would be in the same plane.

Figure 3:
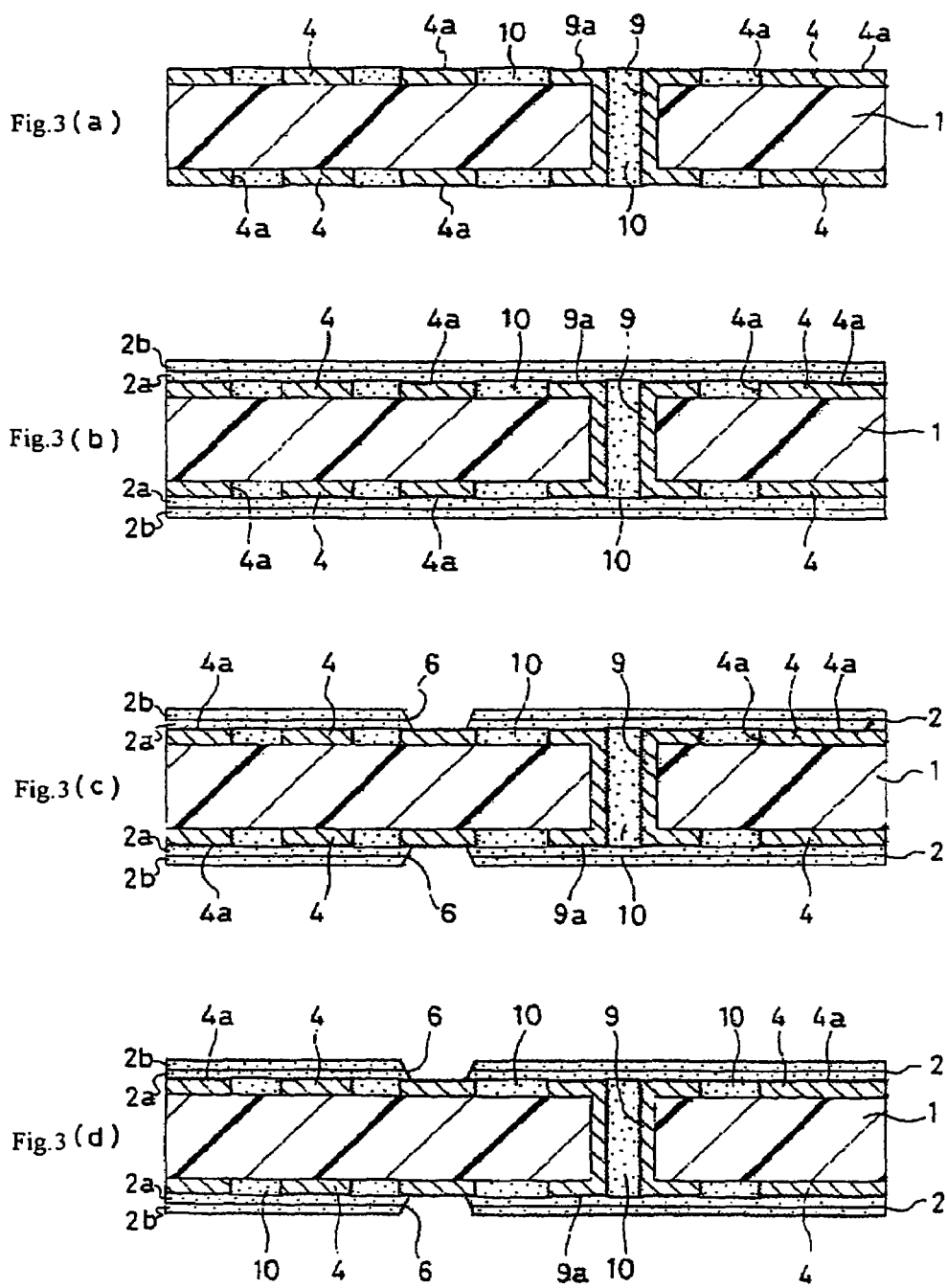
FIGS. 3 (a) to (d) are cross-section figures showing a part of processes of manufacturing a multilayer printed circuit board of the present invention.

(5) After the foregoing substrate was washed with water and degreased with an acid, soft etching was carried out. And then, the surfaces of the under-level conductor circuits 4 and the land surface of the plated-through hole 9 were etched by spraying an etching solution to both sides by sprays and then transported by transporting rolls to form roughened faces 4a, 9a with the thickness of 3 μm in the entire surfaces of the under-level conductor circuits 4 (reference to FIG. 3(a)). A solution used as the etching solution was an etching solution (Made by Meck Co.: Mek Etch Bond) containing 10 parts by weight of an imidazole-Cu(II) complex, 7 parts by weight of glycolic acid and 5 parts by weight of potassium chloride.

(6) To both sides of the substrate, the resin composite (viscosity: 1.5 Pa·s) for an underlayer described in the foregoing description B was applied by a roll coater within 24 hours after its preparation and then was left for 20 minutes in horizontal state and dried (pre-baked) at 60° C. for 30 minutes. After that, the resin composite (viscosity: 7 Pa·s) for an upper layer described in the foregoing description A was applied using a roll coater within 24 hours after its preparation and then left for 20 minutes in horizontal state in the same manner and dried (pre-baked) at 60° C. for 30 minutes to form layers 2a, 2b of the resin composites with thickness of 35 μm (reference FIG. 3(b)).

(7) After a photomask film printed with black circles with the diameter of 85 μm was closely stuck to both sides of the resultant substrate on which the layers of resin composites were formed as described in (6) the substrate was exposed to light of 500 mJ/cm² intensity by an ultra high pressure mercury lamp and then subjected to spray development with a DMDG solution. After that, further the obtained substrate was exposed to light of 3000 mJ/cm² intensity by an ultra high pressure mercury lamp, heated at 100° C. for 1 hour, at 120° C. for 1 hour, and at 150° C. for 3 hours to form a resin insulating layer with the thickness of 35 μm and having opening parts 6 for via-holes with the diameter of 85 μm and a high size precision corresponding to the circle of the photomask film (reference FIG. 3(c)). Incidentally, in the opening part to be a via-hole, the roughened face of an under-level conductor circuit 4 was exposed.

(8) The obtained substrate formed with the opening parts 6 for via-holes was immersed in an aqueous chromic acid solution (7500 g/L) for 19 minutes to dissolve and remove the epoxy resin particle existing on the surface of the resin insulating layer and roughen the surface to obtain a roughened face. After that, the substrate was immersed in a neutralization solution (made by a Shiplay Co., Inc.) and washed with water (reference FIG. 3 (d)).

Further, a palladium catalyst (made by Atotech Co.) was supplied to the surface of the substrate treated by the surface roughening treatment to stick the catalyst nuclei to the surface of the insulating layer and to the inner wall face of the opening part for a via-hole.

Figure 4:
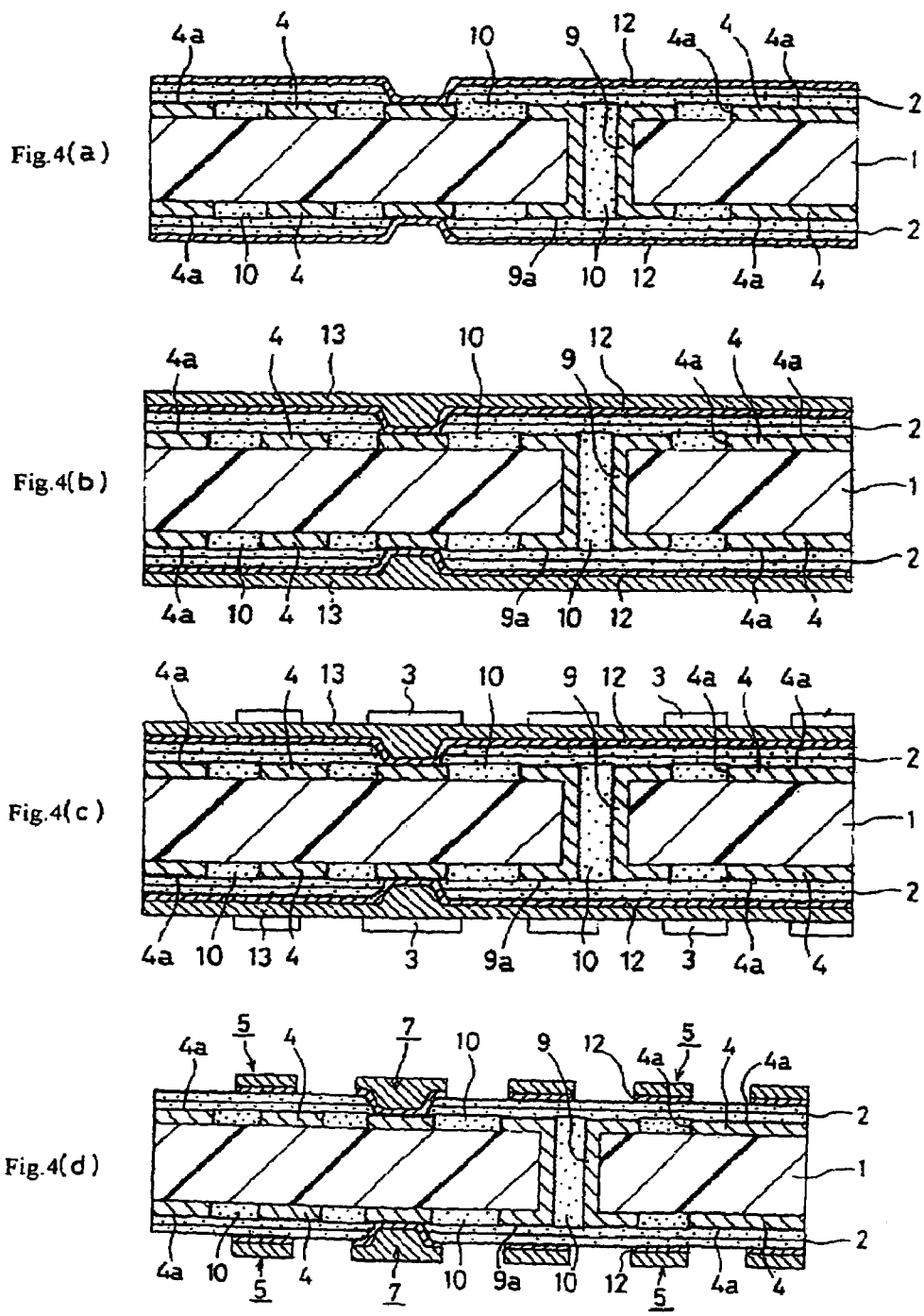
FIGS. 4 (a) to (d) are cross-section figures showing a part of processes of manufacturing a multilayer printed circuit board of the present invention.
Figure 5:
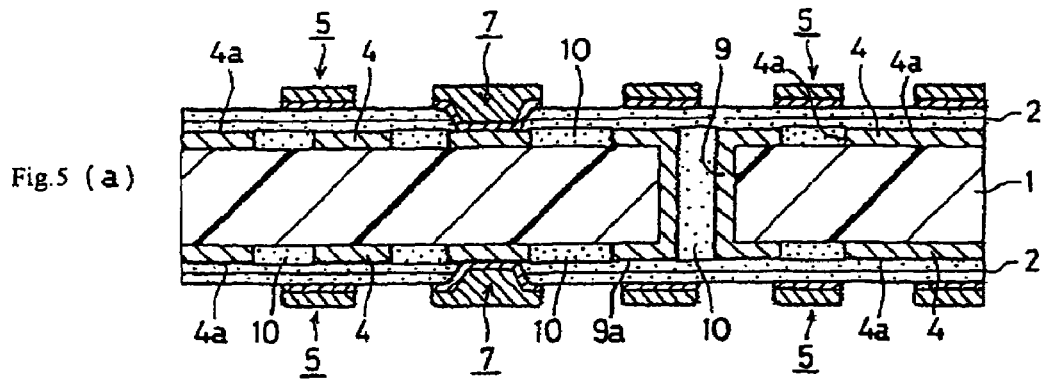
FIGS. 5 (a) to (c) are cross-section figures showing a part of processes of manufacturing a multilayer printed circuit board of the present invention.
Figure 5:
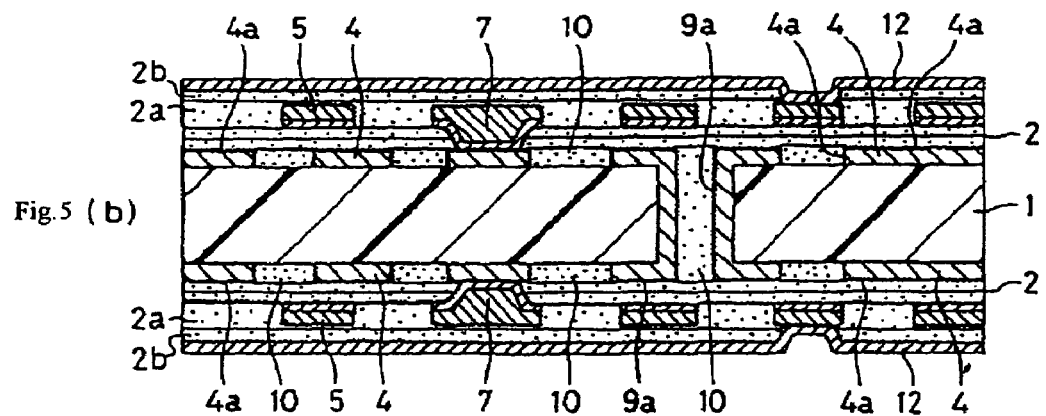
Figure 5:
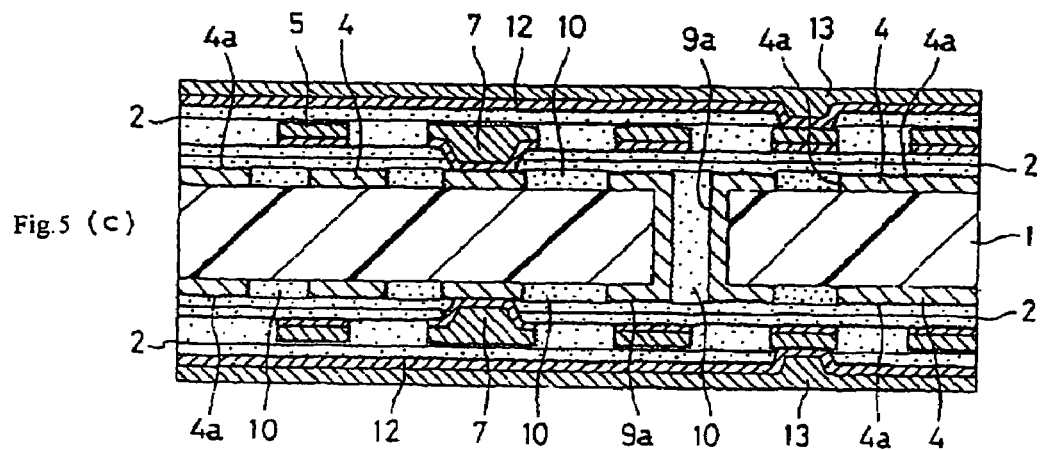
Figure 6:
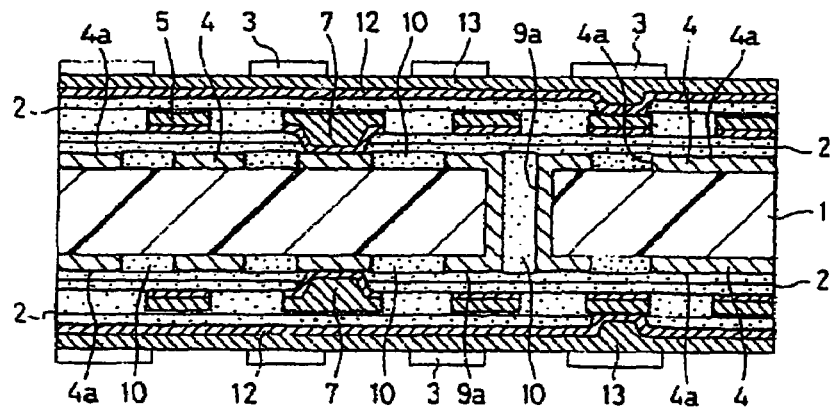
FIGS. 6 (a) to (c) are cross-section figures showing a part of processes of manufacturing a multilayer printed circuit board of the present invention.
Figure 6:
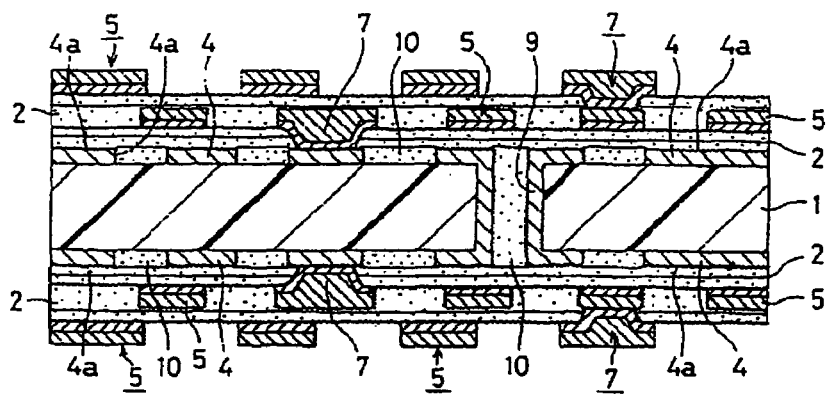
Figure 6:
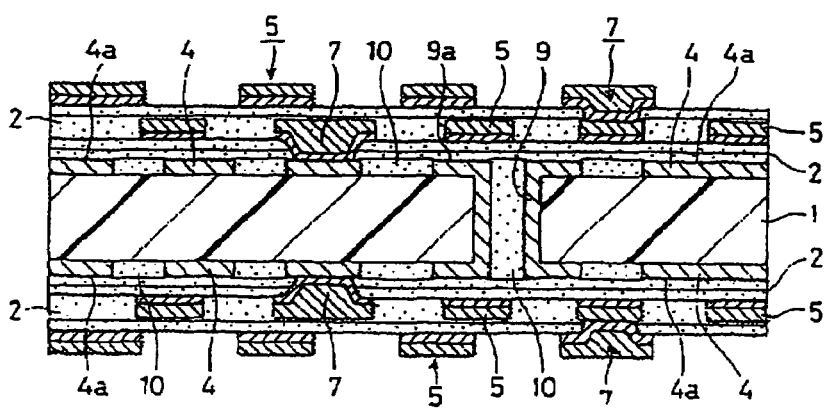

(9) Next, the substrate was immersed in an aqueous electroless copper plating solution of the following composition to form an electroless copper plating film 12 with the thickness of 0.6 to 1.2 μm on the entire roughened surface (reference FIG. 4 (a)):

[The Aqueous Electroless Plating Solution]

| | |
|---|---|
| $CuSO_4\text{-}5H_2O$ | 10 g/L |
| HCHO | 8 g/L |
| NaOH | 8 g/L |
| Rochelle salt | 45 g/L |
| an additive | 30 ml/L |

[The Electroless Plating Conditions]

at 35° C. solution temperature for 25 minutes.

(10) Next, electroplating on the entire surface of the electroless copper plating film was carried in the following conditions to form an electroplating film 13 with the thickness of 7.5 μm (reference to FIG. 4(b)):

[The Aqueous Electroplating Solution]

| | |
|---|---|
| $CuSO_4\text{-}5H_2O$ | 210 g/L |
| sulfuric acid | 150 g/L |
| $Cl^-$ | 40 mg/L |
| polyethylene glycol | 300 mg/L |
| bisdisulfide | 100 mg/L |

[The Electroplating Conditions]

| | |
|---|---|
| current density | 1.0 A/dm² |
| duration | 35 minutes |
| temperature | 25° C. |

(11) A photosensitive dry film sold on the market was stuck to the electrolytic copper plating film 13, a mask was put thereon, exposure was carried out at 100 mJ/cm², and development treatment was carried out with an aqueous solution of 0.8% sodium carbonate to form an etching resist 3 with the thickness of 15 μm (reference FIG. 4(c)).

(12) Further, the parts other than the conductor circuits were etched by spray etching using an aqueous sulfuric acid/hydrogen peroxide solution. Successively, the resist film was separated and removed in an aqueous solution of 40 g/L NaOH at 50° C. After that, the resultant substrate was subjected to heating treatment at 150° C. for 1 hour to form a conductor circuit with the thickness of 15 μm, which is composed of the metal layer and the electrolytic copper plating film and a filled via (reference FIG. 4(d)).

(13) To the substrate on which the conductor circuit was formed, the same treatment as described in the process (5) was carried out to form a roughened face on the surface of the conductor circuit including the filled via (reference 5(a))

(14) Successively, the foregoing processes (6) to (13) were repeated to form conductor circuits in further upper layers to obtain a multilayer printed circuit board with 8 layers. Incidentally, in Figs., one with 6 layers was illustrated to make the structure easily understandable (reference FIG. 5(b) to FIG. 6(d)).

(15) Next, a solder resist resin composition with the viscosity of 2.0 Pa·s at 25° C. was obtained by blending 46.67 parts by weight of photosensitive oligomer (molecular weight: 4000) which was a cresol novolak type epoxy resin (made by Nippon Kayaku Co., Ltd.) whose 50% of epoxy group was acrylated and which was dissolved in 60 wt. % concentration in diethylene glycol methyl ether (DMDG), 15 parts by weight of a bisphenol A type epoxy resin (made by Yuka Shell Epoxy Co.: Epikote 1001) dissolved in 80 wt. % concentration in methyl ethyl ketone, 1.6 parts by weight of an imidazole curing agent (made by Shikoku Chemicals Corp.: 2E4MZ-CN), 3 parts by weight of a polyvalent acrylic monomer, which is a photosensitive monomer, (made by Nippon Kayaku Co., Ltd.: R 604), 1.5 parts by weight of also a polyvalent acrylic monomer (made by Kyoei Chemical Co., Ltd.: DPE 6A), and 0.71 parts by weight of a dispersion type defoaming agent (made by San Nopco Ltd.: S-65) in a container and mixing and stirring the obtained mixture and further adding 2.0 parts by weight of benzophenone (made by Kanto Chemical Co., Inc.) as a photopolymerization initiator to the obtained mixture composition and 0.2 parts by weight of Michler's ketone (made by Kanto Chemical Co., Inc.) as a photosensitizer.

Incidentally, the viscosity measurement was carried out using a rotor No. 4 and a rotor No. 3 of a B type viscometer (made by Tokyo Instruments, DVL-B type) in the case of 60 min$^{-1}$ (60 rpm) and 4.6 min$^{-1}$ (6 rpm), respectively.

(16) Next, after the solder resist resin composition was produced as described foregoing (15), the composition was applied to both sides of the multilayer wiring substrate in 20 μm thickness, dried at 70° C. for 20 minutes and at 70° C. for 30 minutes, exposed to UV rays of 1000 mJ/cm$^2$ intensity while being closely covered with a 5 mm-thick photomask drawing a pattern corresponding to the opening parts of the solder resist, then the development with a DMTG solution was carried out to form an opening with the diameter of 200 μm.

Further, the resultant solder resist layer was hardened by heating in conditions: at 80° C. for 1 hour, at 100° C. for 1 hour, at 120° C. for 1 hour, and at 150° C. for 3 hours to form a solder resist layer 14 (an insulating organic resin layer) with the thickness of 20 μm and having openings in a solder pad part (including a via-hole and its land part) with opening diameter of 200 μm.

(17) Next, the substrate bearing the solder resist layer (an insulating organic resin layer) 14 was immersed for 20 minutes in an electroless nickel plating solution at pH 4.5 containing nickel chloride (2.3×10$^{-1}$ mol/L), sodium hypophosphite (2.8×10$^{-1}$ mol/L), and sodium citrate (1.6×10$^{-1}$ mol/L) to form a nickel plating layer 15 in the opening part with the thickness of 5 μm. Further, the resultant substrate was immersed for 7.5 minutes at 80° C. in an electroless plating solution containing potassium cyanoaurate (7.6×10$^{-3}$ mol/L), ammonium chloride (1.9×10$^{-1}$ mol/L), sodium citrate (1.2×10$^{-1}$ mol/L) and sodium hypophosphite (1.7×10$^{-1}$ mol/L) to form a gold plating layer 15 on the nickel plating layer 15 with the thickness of 0.03 μm.

Figure 7:
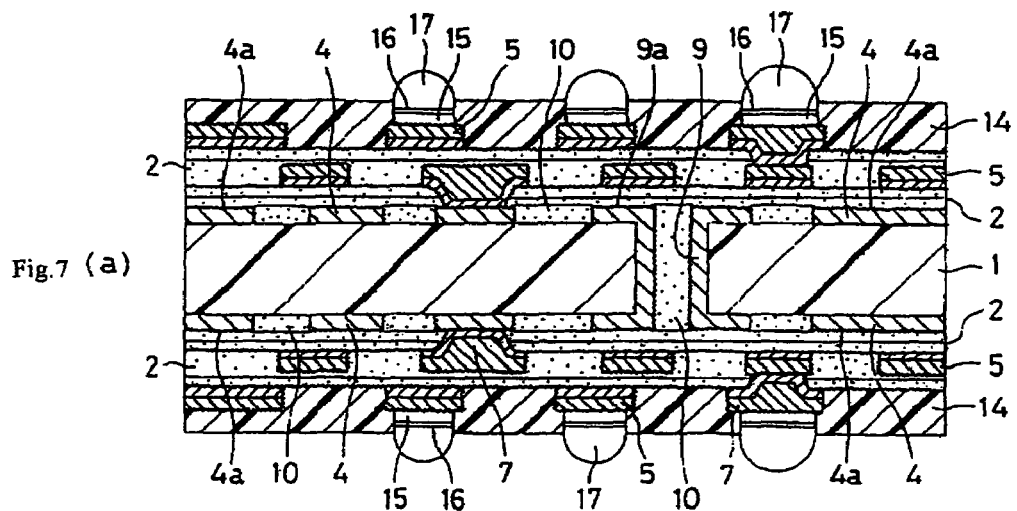
FIG. 7 (a) is a cross-section figure showing a part of processes of manufacturing a multilayer printed circuit board of the present invention.

(18) After that, a solder paste was printed in the openings of the solder resist layer 14 and subjected to reflow at 200° C. to form solder bumps 17 and to manufacture a multilayer printed circuit board having solder bumps 17 (reference to FIG. 7 (a)).

EXAMPLE 2

Figure 8A:
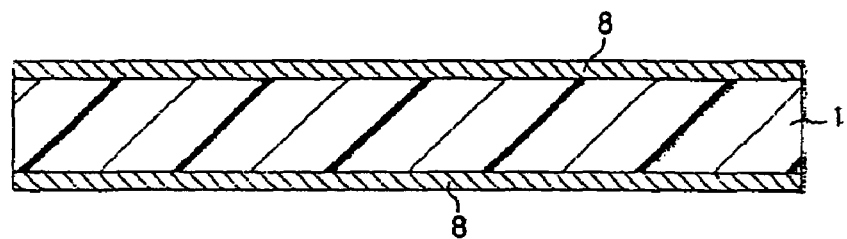
FIGS. 8 (a) to (d) are cross-section figures showing a part of processes of manufacturing a multilayer printed circuit board of the present invention.
Figure 8B:
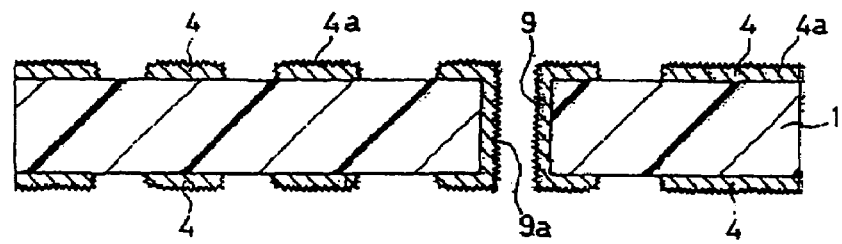
Figure 8C:
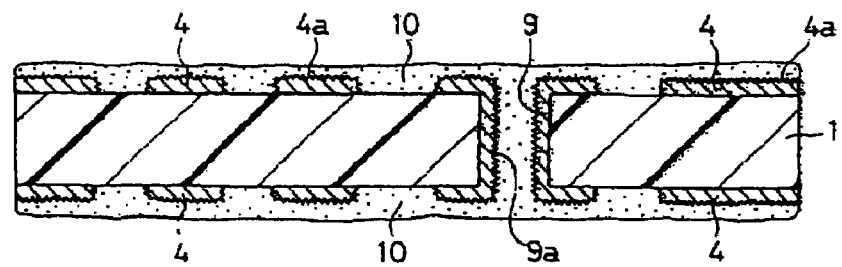
Figure 8D:
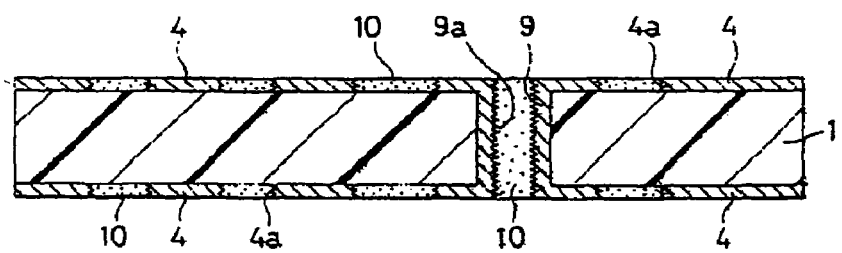

A. A Method for Manufacturing a Printed Circuit Board (1) A copper-laminated laminate plate composed of a substrate 1 which is made of a 0.8 mm-thick glass epoxy resin or BT (bismaleimide triazine) resin with a 18 μm-thick copper foil 8 laminated on both sides of the substrate 1 was used as a starting material (reference to FIG. 8(a)). At first, the copper-laminated laminate plate was drilled to form a through hole, subjected to electroless plating treatment and then etching treatment in a pattern to form an under-level conductor circuit 4 in both sides of the substrate 1 and a plated-through hole 9.

(2) After the resultant substrate in which the plated-through hole 9 and the under-level conductor circuits 4 are formed was washed with water and dried, the following etching solution was sprayed to both sides of the substrate to etch the under-level conductor circuits 4 and the land surface and the inner wall of the plated-through hole 9 and form roughened surfaces 4a, 9a in the entire surface of the under-level conductor circuits 4 including the plated-through hole 9 (reference FIG. 8 (b)). The solution used as the etching solution was produced by mixing 10 parts by weight of an imidazole-Cu(II) complex, 7 parts by weight of glycolic acid, 5 parts by weight of potassium chloride, and 78 parts by weight of ion exchanged water.

(3) Next, a resin filler mainly containing a polyolefin type resin was applied to both sides of the substrate using a printing apparatus to fill the space between the under-level conductor circuits 4 and fill the plated-through hole 9 and heated and dried (reference FIG. 8 (c)). That is, through this process, the resin filler 10 filled the space between the under-level conductor circuits 4 and the inside of the plated-through hole 9.

(4) One side of the resultant substrate already subjected to the above described treatment (3) was subjected to polishing to polish the layer of the resin filler 10 formed in the outer peripheries of the conductor circuits and the upper part of the layer of the resin filler 10 formed in the conductor circuit non forming area by belt sander polishing using #600 belt polishing paper (made by Sankyo Chemical Engneering Co.) and then subjected to buffing to remove the scars formed by the foregoing belt sander polishing. A series of such polishing steps were carried out for the other side in the same manner.

Incidentally, if necessary, etching might be carried out before and after the polishing to level a land 9a of the plated though hole 9 and the roughened faces 4a formed in the under-level conductor circuits 4.

After that, heating treatment at 100° C. for 1 hour and successively at 150° C. for 1 hour was carried out to completely harden the layer of the resin filler.

In such a way, the surface layer part of the resin filler 10 formed in the plated-through hole 9 and in the conductor circuit non forming area and the surfaces of the under-level conductor circuits 4 were leveled to obtain an insulating substrate where the resin filler 10 and the side faces 4a of the under-level conductor circuits 4 were firmly stuck to each other through the roughened faces, and the inner wall face 9 of the plated-through hole 9 and the resin filler 10 were firmly stuck to each other through the roughened faces (reference to FIG. 8 (d)).

(5) After the foregoing substrate was washed with water and degreased with an acid, soft etching was carried out and then the surfaces of the under-level conductor circuits 4 and the land surface of the plated-through hole 9 were etched by spraying an etching solution to both sides by sprays and after that the substrate was transported by transporting rolls to form roughened faces 4a, 9a with the thickness of 3 μm in the entire surfaces of the under-level conductor circuits 4. An etching solution used was the same one used in the foregoing process (2).

Figure 9A:
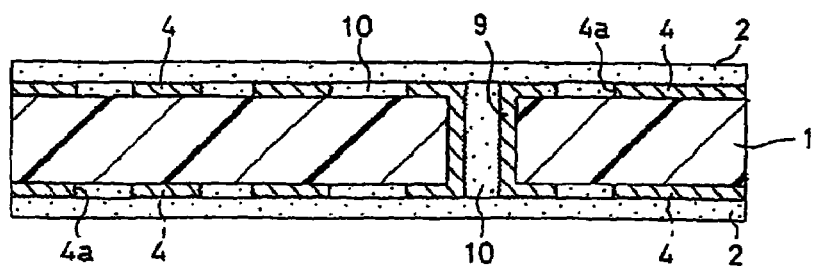
FIGS. 9 (a) to (d) are cross-section figures showing a part of processes of manufacturing a multilayer printed circuit board of the present invention.

(6) To both sides of the substrate, a thermosetting type polyolefin type resin sheet with the thickness of 50 μm was vacuum-laminated at the pressure of 0.5 MPa (5 kgf/cm$^2$) with the temperature being increased from 50 to 150° C. to form a resin insulating layer of the polyolefin type resin in each side. The vacuum degree at the time of vacuum bonding was controlled to be 1330 Pa (10 mmHg) (reference FIG. 9(a)).

Figure 9B:
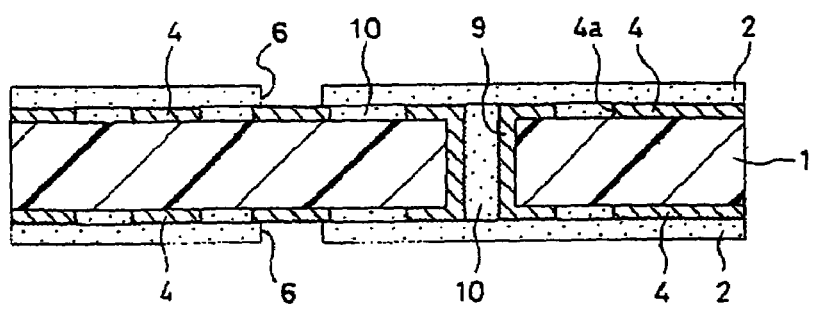

(7) Opening parts 6 for via-holes with diameter of 80 μm were formed in both sides of the substrate bearing the resin insulating layers by carbon dioxide ($CO_2$) gas laser in the conditions of beam diameter of 5 mm, in the top hat mode, pulse width of 50 μsecond, the mask's hole diameter of 0.5 mm, and 3 shots (reference FIG. 9(b)). After that, de-smear treatment was carried out using oxygen plasma.

Figure 9C:
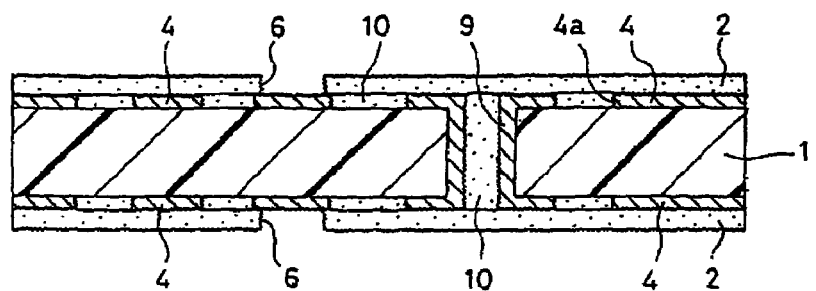
Figure 9D:
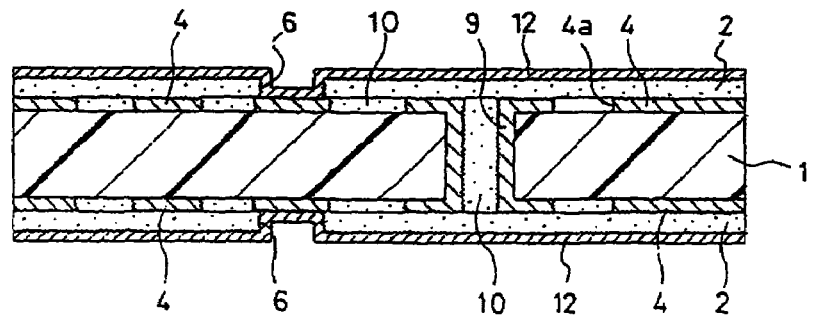

(8) Plasma treatment was carried out to the obtained substrate in which the opening parts 6 for via-holes were formed to roughen the surface of the resin insulating layers (reference FIG. 9(c)). At that time, argon was used as an inert gas and the plasma treatment was carried out using SV-4540 made by ULVAC Japan Co., Ltd. for 2 minutes in conditions of electric power of 200 W, the gas pressure of 0.6 Pa and the temperature of 70° C.

(9) Next, sputtering a target of an alloy of Ni and Cu was carried out to the substrate, in which the surface layers of the resin insulating layers were roughened, using SV-4540 made by ULVAC Japan Co., Ltd. in the conditions of the pressure of 0.6 Pa, the temperature of 80° C., electric power of 200 W, and 5 minute to form a Ni—Cu alloy layer 12 on each surface of resin insulating layer 2 (reference FIG. 9 (d)). In this case, the thickness of the formed Ni—Cu alloy layer was 0.2 μm.

Further, the substrate was subjected to conditioning and catalyst supply treatment was carried out for 5 minutes in an alkaline catalyst.

Figure 10A:
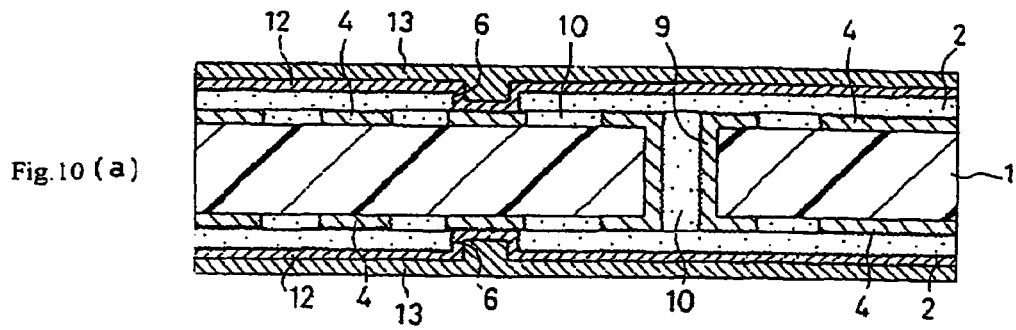
FIGS. 10 (a) to (c) are cross-section figures showing a part of processes of manufacturing a multilayer printed circuit board of the present invention.

(10) Next, electroplating of the entire surface of the Ni—Cu alloy layer 12 was carried out in the following conditions to form an electroplating film 13 with the thickness of 5 μm (reference to FIG. 10(a)):

[The Aqueous Electroplating Solution]

| | |
|---|---|
| $CuSO_4$-$5H_2O$ | 140 g/L |
| sulfuric acid | 120 g/L |
| Cl$^-$ | 50 mg/L |
| gelatin | 300 mg/L |
| sulfonic acid amide | 100 mg/L |

[The Electroplating Conditions]

| | |
|---|---|
| current density | 0.8 A/dm$^2$ |
| duration | 30 minutes |
| temperature | 25° C. |

Figure 10B:
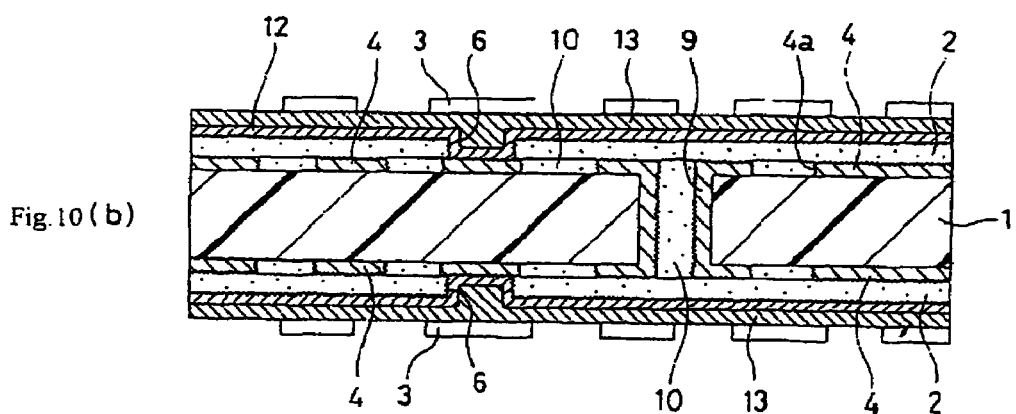

(11) A photosensitive dry film sold on the market was stuck to the electrolytic copper plating film 13, a mask was put thereon, exposure was carried out at 100 mJ/cm$^2$, and development treatment was carried out with an aqueous solution of 0.8% sodium carbonate to form an etching resist 3 with the thickness of 20 μm (reference FIG. 10(b)).

Figure 10C:
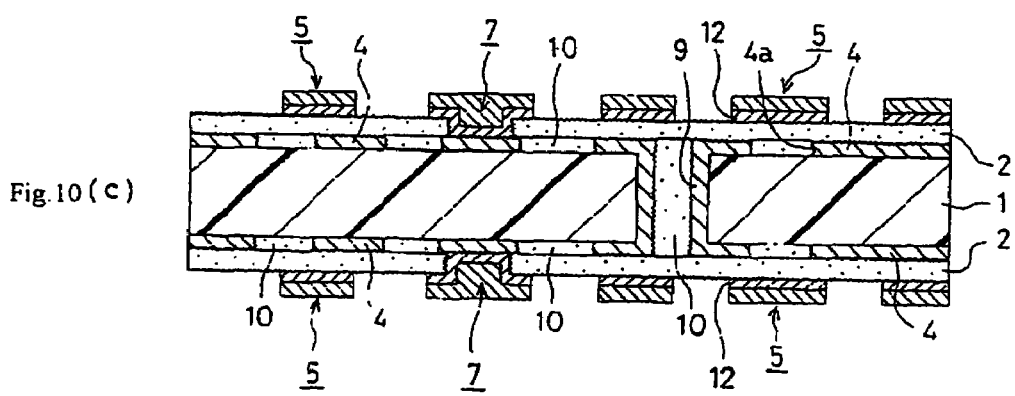

(12) Further, the parts other than the conductor circuits were etched by spray etching using an aqueous sulfuric acid/hydrogen peroxide solution. Successively, the resist film was separated and removed in an aqueous solution of 40 g/L NaOH at 50° C. After that, the resultant substrate was subjected to heating treatment at 150° C. for 1 hour to form a conductor circuit with the thickness of 15 μM, which is composed of the metal layer and the electrolytic copper plating film and a filled via 7. The height difference of the height of the upper face of the formed conductor circuit and the height of the upper face of the filled via from the resin substrate 1 was 1 μm or thinner and thus both upper faces are approximately in the same plane and no recessed part was formed in the upper of the via-hole (reference FIG. 10(c)).

Figure 11:
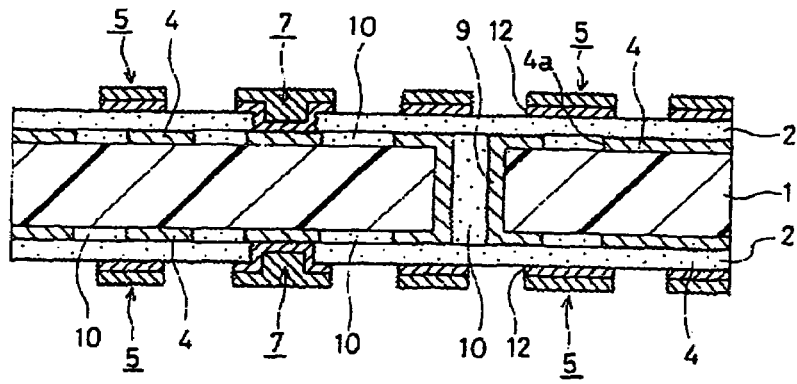
FIGS. 11 (a) to (c) are cross-section figures showing a part of processes of manufacturing a multilayer printed circuit board of the present invention.
Figure 11:
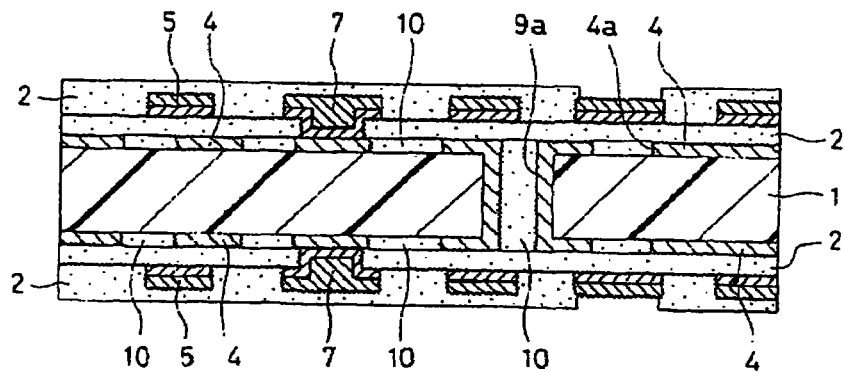
Figure 11:
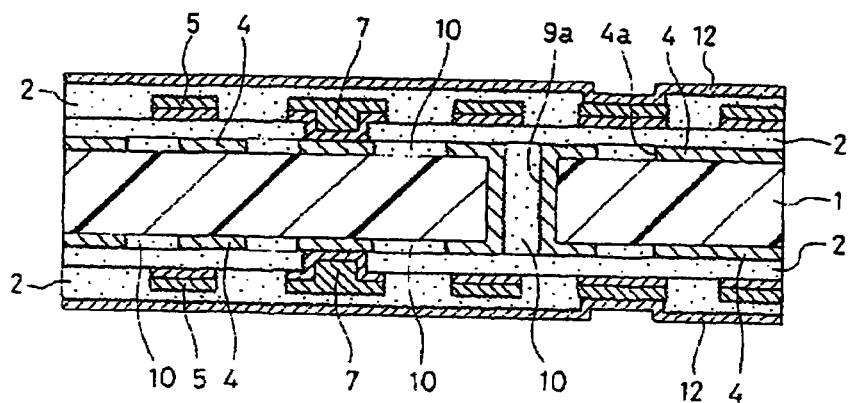
Figure 12:
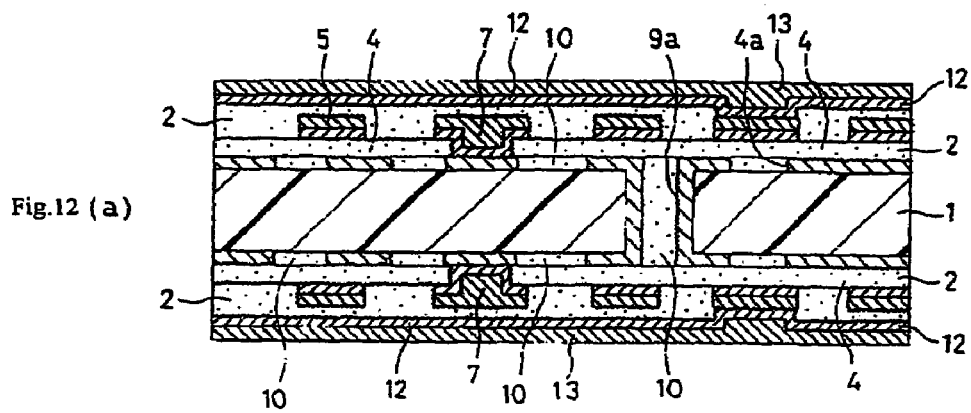
FIGS. 12 (a) to (c) are cross-section figures showing a part of processes of manufacturing a multilayer printed circuit board of the present invention.
Figure 12:
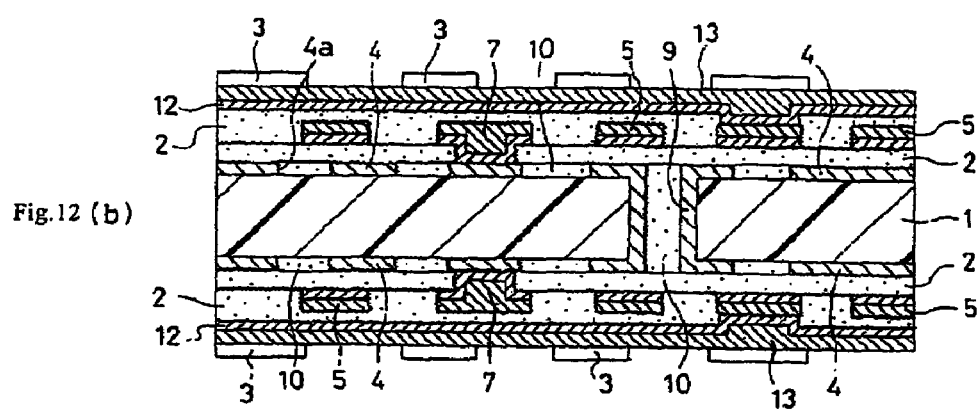
Figure 12:
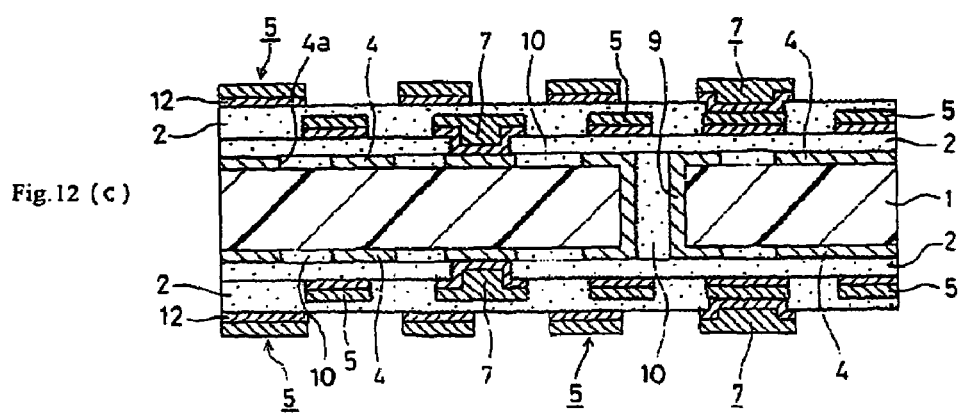
Figures 13A, 13B:
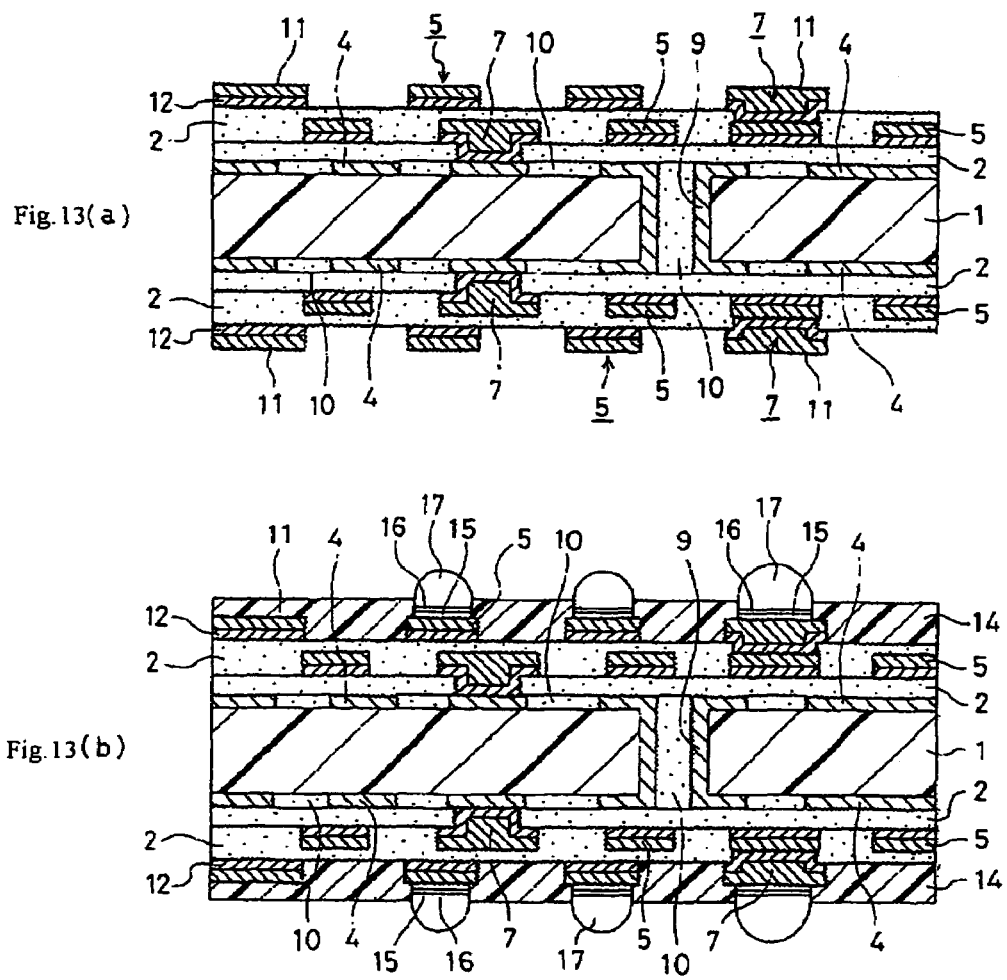
FIGS. 13 (a) to (b) are cross-section figures showing a part of processes of manufacturing a multilayer printed circuit board of the present invention.
Figure 14A:
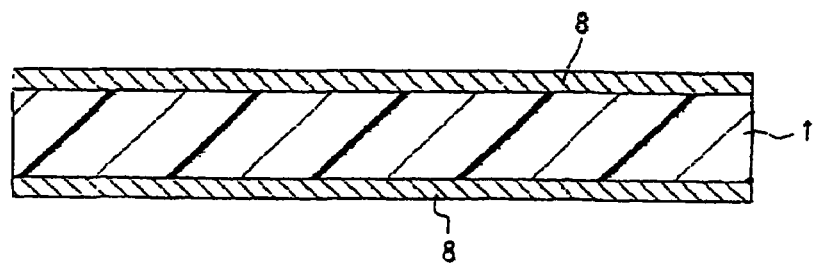
FIGS. 14 (a) to (d) are cross-section figures showing a part of processes of manufacturing a multilayer printed circuit board of the present invention.
Figure 14B:
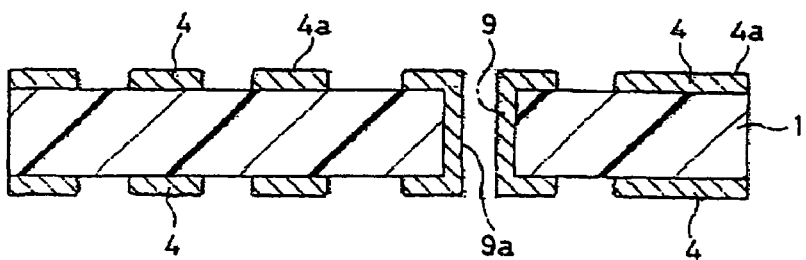
Figure 14C:
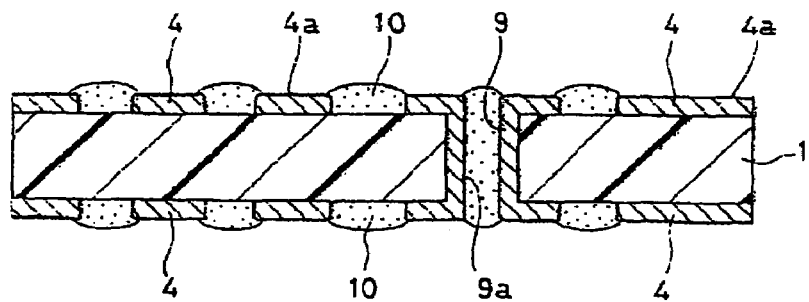
Figure 14D:
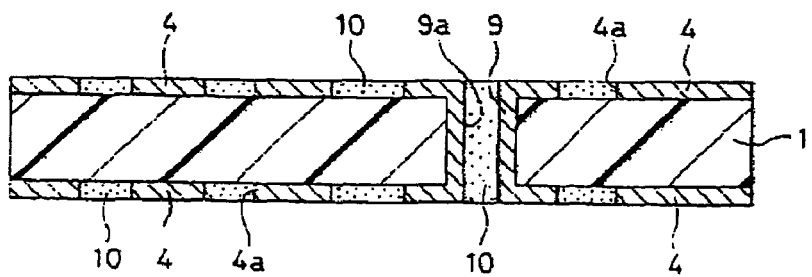

(13) Successively, the foregoing processes (7) to (13) were repeated to form conductor circuits in further upper layers and obtain a multilayer printed circuit board with 8 layers. Incidentally, in Figs., one with 6 layers was illustrated to make the structure easily understandable (reference FIG. 11 (a) to FIG. 13(a)).

Additionally, etching was carried out to the conductor circuit in the surface layer using the same etching solution used in the foregoing process (2) to roughen the surface.

(14) Next, a solder resist resin composition with the viscosity of 2.0 Pa·s at 25° C. was obtained by blending 46.67 parts by weight of photosensitivity providing oligomer (molecular weight: 4000) which was a cresol novolak type epoxy resin (made by Nippon Kayaku Co., Ltd.) whose 50% of epoxy group was acrylated and which was dissolved in 60 wt. % concentration in diethylene glycol methyl ether (DMDG), 15 parts by weight of a bisphenol A type epoxy resin (made by Yuka Shell Epoxy Co.: Epikote 1001) dissolved in 80 wt. % concentration in methyl ethyl ketone, 1.6 parts by weight of an imidazole curing agent (made by Shikoku Chemicals Corp.: 2E4MZ-CN), 3 parts by weight of a polyvalent acrylic monomer, a photosensitive monomer, (made by Nippon Kayaku Co., Ltd.: R 604), 1.5 parts by weight of also a polyvalent acrylic monomer (made by Kyoei Chemical Co., Ltd.: DPE 6A), and 0.71 parts by weight of a dispersion type defoaming agent (made by San Nopco Ltd.: S-65) in a container and mixing and stirring the obtained mixture and further adding 2.0 parts by weight of benzophenone (made by Kanto Chemical Co., Inc.) as a photopolymerization initiator to the obtained mixture composition and 0.2 parts by weight of Michler's ketone (made by Kanto Chemical Co., Inc.) as a photosensitizer.

Incidentally, the viscosity measurement was carried out using a rotor No. 4 and a rotor No. 3 of a B type viscometer (made by Tokyo Instruments, DVL-B type) in the case of 60 min$^{-1}$ (60 rpm) and 4.6 min$^{-1}$ (6 rpm), respectively.

(15) Next, after the solder resist resin composition was produced as described above (14), the composition was applied to both sides of the multilayer wiring substrate in 20 μm thickness, dried at 70° C. for 20 minutes and at 70° C. for 30 minutes, exposed to UV rays of 1000 mJ/cm$^2$ intensity while being closely covered with a 5 mm-thick photomask drawing a pattern corresponding to the opening part of the solder resist was drawn, and developed with a DMTG solution to form an opening with the diameter of 200 μm.

Further, the resultant solder resist layer was hardened by heating in conditions: at 80° C. for 1 hour, at 100° C. for 1 hour, at 120° C. for 1 hour, and at 150° C. for 3 hours to form a 20 μm-thick solder resist layer 14 (an insulating organic resin layer) having openings in solder pad parts (including a via-hole and its land part) with opening diameter of 200 μm.

(16) Next, the substrate bearing the solder resist layer (an insulating organic resin layer) 14 was immersed for 20 minutes in an electroless nickel plating solution at pH 4.5 containing nickel chloride ($2.3 \times 10^{-1}$ mol/L), sodium hypophosphite ($2.8 \times 10^{-1}$ mol/L), and sodium citrate ($1.6 \times 10^{-1}$ mol/L) to form a nickel plating layer 15 in the opening part with the thickness of 5 μm. Further, the resultant substrate was immersed for 7.5 minutes at 80° C. in an electroless plating solution containing potassium cyanoaurate ($7.6 \times 10^{-3}$ mol/L), ammonium chloride ($1.9 \times 10^{-1}$ mol/L), sodium citrate ($1.2 \times 10^{-1}$ mol/L) and sodium hypophosphite ($1.7 \times 10^{-1}$ mol/L) to form a gold plating layer 15 on the nickel plating layer 15 with the thickness of 0.03 μm.

(17) After that, a solder paste was printed in the opening of the solder resist layer 14 and subjected to reflow at 200° C. to form solder bumps 17 and to manufacture a multilayer printed circuit board having solder bumps 17 (reference to FIG. 13(*b*))

EXAMPLE 3

A. A Method for Manufacturing a Printed Circuit Board (1) In the same manner as the processes (1) to (8) of the example 1, a substrate bearing conductor circuits 4 and resin insulating layers 2 was produced and after that, an electroless copper plating film 12 was formed in the same manner as the process (9) of the example 1 (reference FIG. 14 (*a*) to FIG. 16 (*a*)).

(2) A photosensitive dry film sold on the market was stuck to the electrolytic copper plating film 12, a mask was put thereon, exposure was carried out at 100 mJ/cm², and development treatment was carried out with an aqueous solution of 0.8% sodium carbonate to form a plating resist 23 with the thickness of 15 μm (reference FIG. 16(*b*)).

(3) Next, electroplating of the parts where no plating resist 23 was formed was carried in the following conditions to form an electroplating film 13 with the thickness of 7.5 μm (reference to FIG. 15(*c*)):

[The Aqueous Electroplating Solution]

| | |
|---|---|
| CuSO$_4$-5H$_2$O | 210 g/L |
| sulfuric acid | 150 g/L |
| Cl⁻ | 40 mg/L |
| polyethylene glycol | 300 mg/L |
| bisdisulfide | 100 mg/L |

[The Electroplating Conditions]

| | |
|---|---|
| current density | 1.0 A/dm² |
| duration | 35 minutes |
| temperature | 25° C. |

Successively, the resist was parted and removed in an aqueous solution of 40 g/L NaOH at 50° C. After that, the resultant substrate was subjected to heating treatment at 150° C. for 1 hour and treated with an etching solution of an aqueous solution of sulfuric acid and hydrogen peroxide to remove the metal in parts other than the conductor circuit and to form the 8 μm-thick conductor circuit composed of the metal layer and the electrolytic copper plating film and filled vias 7 (reference FIG. 16(*d*)).

Figure 17:
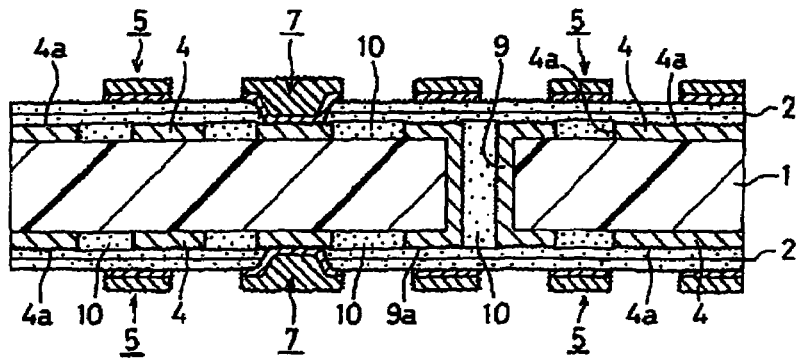
FIGS. 17 (a) to (c) are cross-section figures showing a part of processes of manufacturing a multilayer printed circuit board of the present invention.
Figure 17:
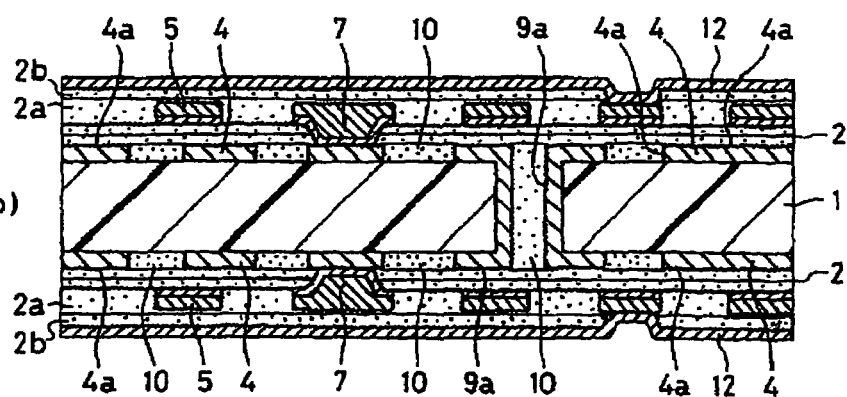
Figure 17:
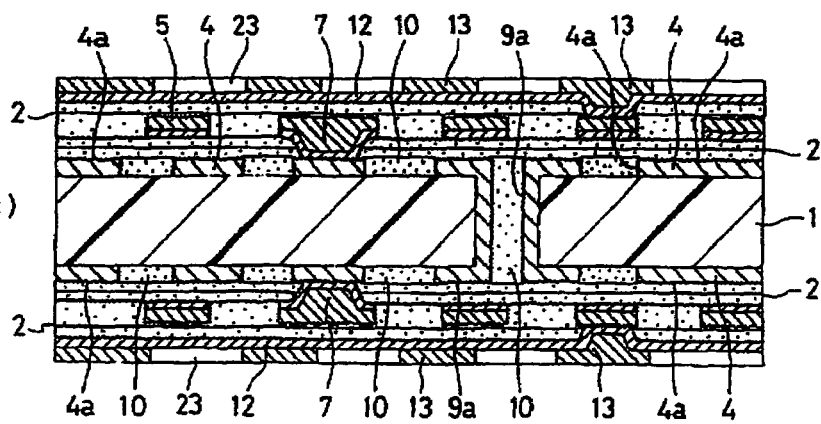
Figure 18:
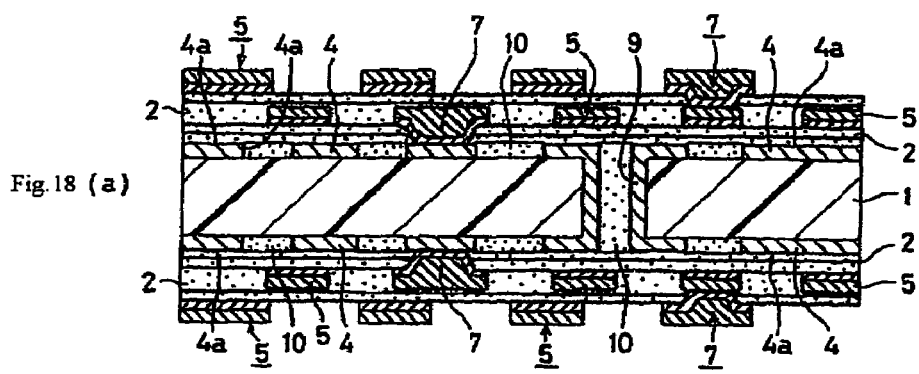
FIGS. 18 (a) to (c) are cross-section figures showing a part of processes of manufacturing a multilayer printed circuit board of the present invention.
Figure 18:
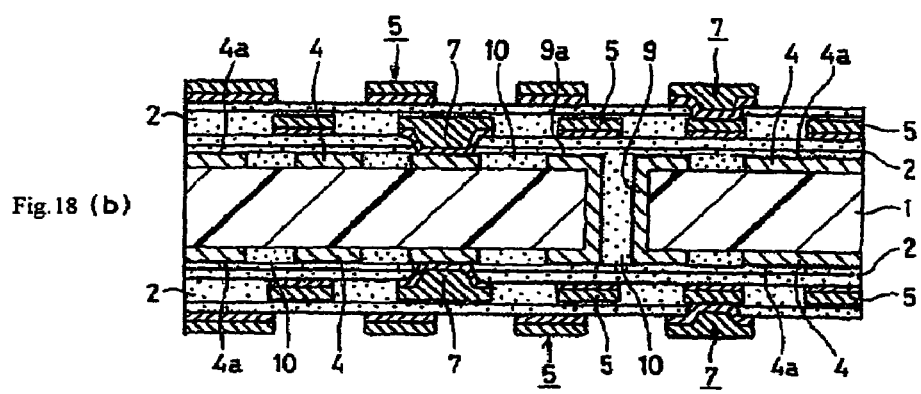
Figure 18:
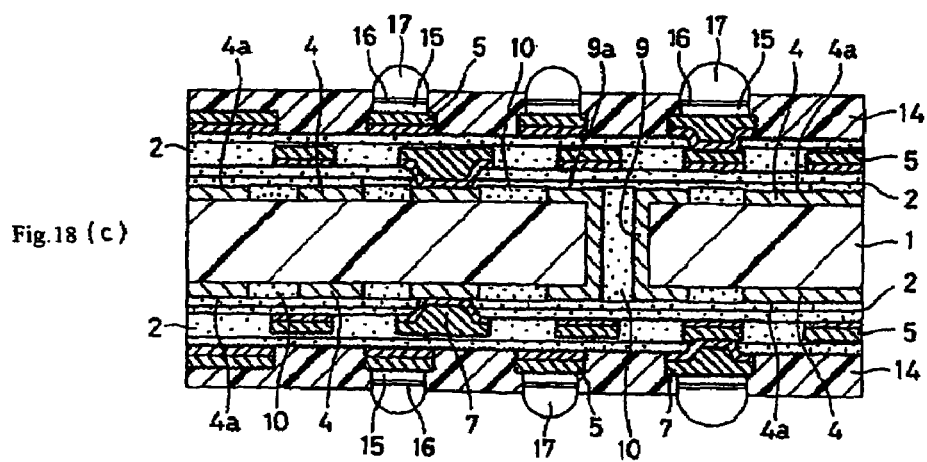
Figure 19A:
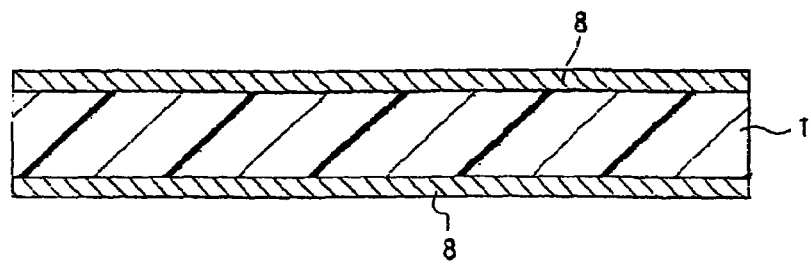
FIGS. 19 (a) to (d) are cross-section figures showing a part of processes of manufacturing a multilayer printed circuit board of the present invention.
Figure 19B:
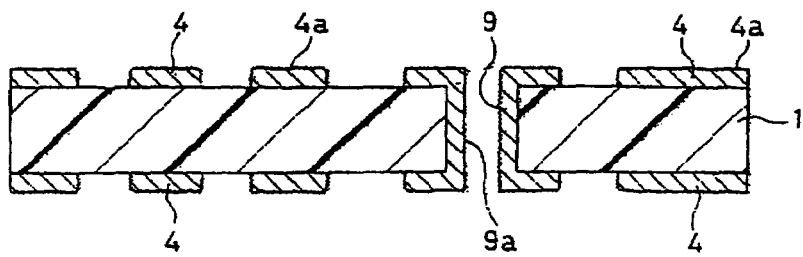
Figure 19C:
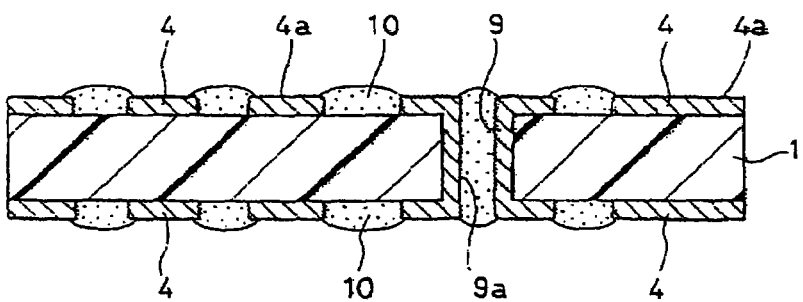
Figure 19D:
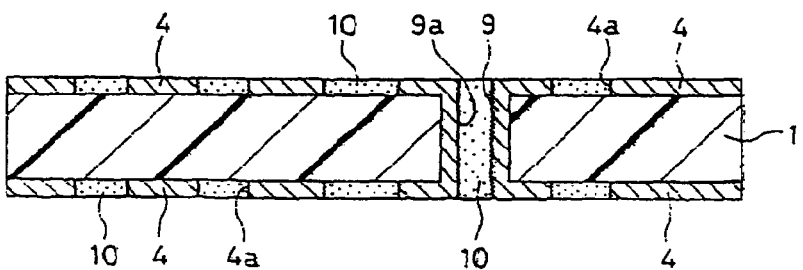

(4) After that, the same processes as the processes (13) to (18) of the example 1 were carried out to manufacture a multilayer printed circuit board having solder bumps 17 (reference to FIG. 17 to FIG. 18).

EXAMPLE 4

A. Preparation of a Film of a Resin Composite

A solution of a resin composite was obtained by heating and dissolving 30 parts by weight of bisphenol A type epoxy resin (epoxy equivalent 469: made by Yuka Shell Epoxy Co.: Epikote 1001), 40 parts by weight of a cresol novolak type epoxy resin (epoxy equivalent 215; Dainippon Ink and Chemicals, Inc.: Epiclon N-673) and 30 parts by weight of a phenol novolak resin having a triazine structure (phenolic hydroxyl equivalent 120: made by Dainippon Ink and Chemicals, Inc.: Phenolite KA-7052) in 20 parts by weight of ethyl diglycol acetate and 20 parts by weight of solvent naphtha and further adding 15 parts by weight of epoxy-terminated polybutadiene rubber (made by Nagase Chemicals Ltd.: Denalex R-45 EPT), 1.5 parts by weight of a milled product of 2-phenyl-4,5-bis(hydroxymethyl) imidazole, 2 parts by weight of fine powdered silica, and 0.5 parts by weight of silicon type defoaming agent.

The obtained solution of the resin composite was applied to a PET film using a roll coater as to adjust the thickness after drying to be 50 μm and then dried at 80 to 120° C. for 10 minutes to produce a film of the resin composite.

B. A Method for Manufacturing a Printed Circuit Board (1) In the same manner as the processes (1) to (4) of the example 1, a substrate bearing a layer of a resin filler 10 in the plated-through holes 9 and the conductor circuit non forming area was produced and after that, the surface of an under-level conductor circuit 4 and the land surface of the plated-through holes 9 were etched in the same manner as the process (5) of the example 1 to form roughened surfaces 4*a*, 9*a* with thickness of 3 μm on the entire surface of the under-level conductor circuit 4 (reference FIG. 19 (*a*) to FIG. 20 (*a*)).

(2) The resin composite film described in the description A was stuck to both sides of the foregoing substrate by the following method using a vacuum laminator apparatus to form a resin composite film layer in each side and then the film layer was thermally hardened to form a resin insulating layer 2 (reference FIG. 20(*b*)). That is, the lamination of the foregoing resin composite film was carried out in conditions of vacuum degree of 75 Pa, the pressure of 0.4 MPa, the temperature at 80° C., and the pressure bonding duration of 60 seconds and the foregoing thermal hardening was carried out in conditions of 100° C. for 30 minutes and 150° C. for 1 hours (3) Next, opening parts 6 for via-holes with diameter of 60 μm was formed in the resin insulating layer by CO$_2$ gas laser of 10.4 μm wavelength in the conditions of beam diameter of 4.0 mm, in the top hat mode, pulse width of 8.0 μsecond, the mask's hole diameter of 1.0 mm, and 2 shots (reference FIG. 20(*c*)). After that, de-smear treatment was carried out using oxygen plasma. Incidentally, the roughened face of an under-level conductor circuit 4 was exposed in the a opening part 6 for a via-hole.

(4) The substrate with the opening parts 6 for via-holes was immersed in an aqueous solution of chromic acid (7500 g/L) for 19 minutes to dissolve and remove epoxy resin particles existing on the surface of the resin insulating layer and to roughen the surface of the resin insulating layer to obtain the roughened surface. After that, the resultant substrate was immersed in a neutralization solution (made by a Shiplay Co., Inc.) and washed with water (reference FIG. 20 (*d*)).

Further, a palladium catalyst (made by Atotech Co.) was supplied to the surface of the substrate treated by the surface roughening to stick the catalyst nuclei to the surface of the insulating layer and to the inner wall face of the opening part 6 for a via-hole.

(5) Next, the substrate was immersed in an aqueous electroless copper plating solution of the following composition to form an electroless copper plating film 12 with the thickness of 0.6 to 1.2 μm on the entire roughened surface (reference FIG. 21 (*a*)):

[The Aqueous Electroless Plating Solution]

| | |
|---|---|
| $CuSO_4 \cdot 5H_2O$ | 10 g/L |
| HCHO | 8 g/L |
| NaOH | 8 g/L |
| Rochelle salt | 45 g/L |
| an additive | 30 ml/L |

[The Electroless Plating Conditions]

at 35° C. solution temperature for 25 minutes.

(6) A photosensitive dry film sold on the market was stuck to the electrolytic copper plating film 12, a mask was put thereon, exposure was carried out at 100 mJ/cm², and development treatment was carried out with an aqueous solution of 0.8% sodium carbonate to form a plating resist 23 with the thickness of 20 μm (reference FIG. 21(*b*)).

(7) Next, electroplating of the parts where no plating resist 23 was formed was carried in the following conditions to form an electroplating film 13 with the thickness of 15 μm (reference to FIG. 21(*c*)):

[The Aqueous Electroplating Solution]

| | |
|---|---|
| $CuSO_4 \cdot 5H_2O$ | 210 g/L |
| sulfuric acid | 150 g/L |
| Cl⁻ | 40 mg/L |
| polyethylene glycol | 300 mg/L |
| bisdisulfide | 100 mg/L |

[The Electroplating Conditions]

| | |
|---|---|
| current density | 1.0 A/dm² |
| duration | 60 minutes |
| temperature | 25° C. |

Successively, the plating resist 23 was parted and removed in an aqueous solution of 40 g/L NaOH at 50° C. After that, the resultant substrate was subjected to heating treatment at 150° C. for 1 hour and treated with an etching solution of an aqueous solution of sulfuric acid-hydrogen peroxide to remove the metal in parts other than the conductor circuit and to form the conductor circuit with the thickness of 15 μm and composed of the metal layer and the electrolytic copper plating film and filled vias 7 (reference FIG. 21(*d*)).

Figure 22A:
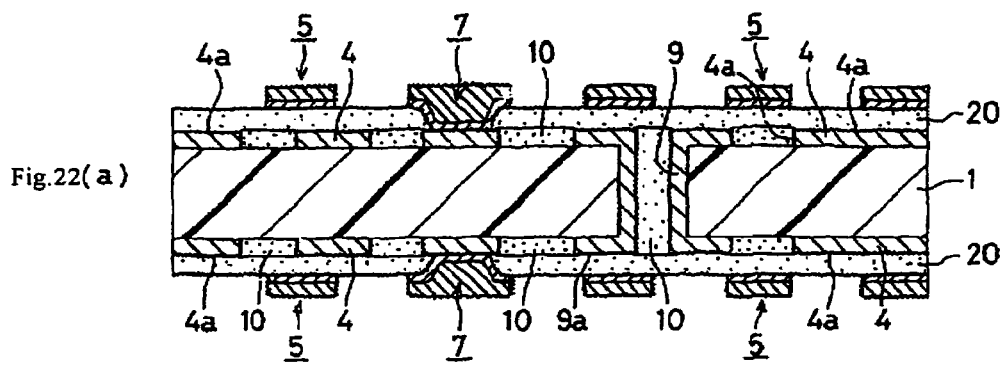
FIGS. 22 (*a*) to (*c*) are cross-section figures showing a part of processes of manufacturing a multilayer printed circuit board of the present invention.
Figure 22B:
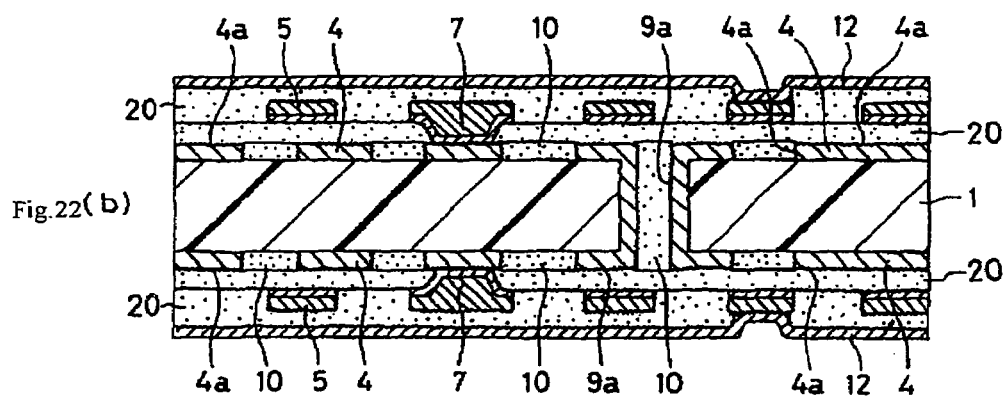
Figure 22C:
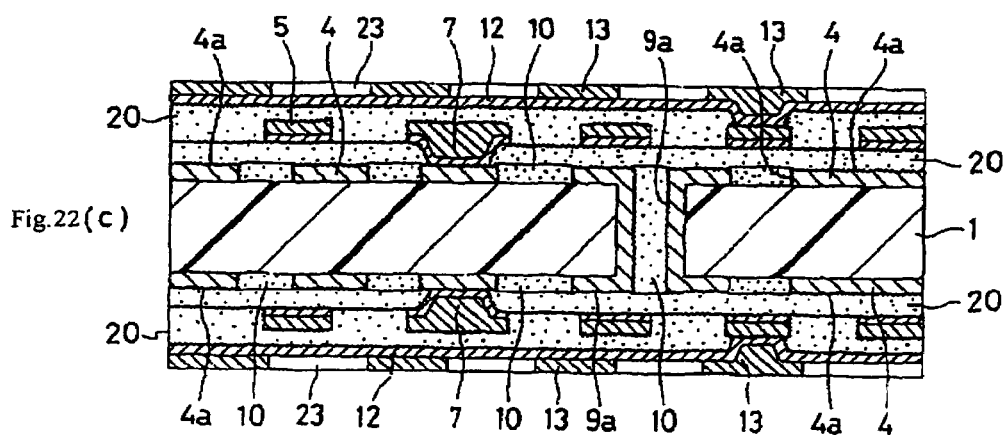

(8) The same treatment as the foregoing process (1) was carried out for the substrate on which the conductor circuit was formed to form roughened face on the surface of the conductor circuit containing the filled via (reference FIG. 22(*a*)).

Figure 23A:
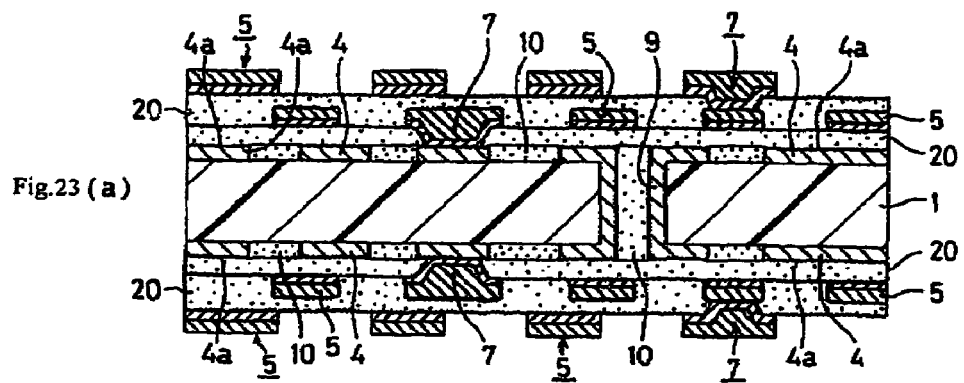
FIGS. 23(*a*) to (*c*) are cross-section figures showing a part of processes of manufacturing a multilayer printed circuit board of the present invention.
Figure 23B:
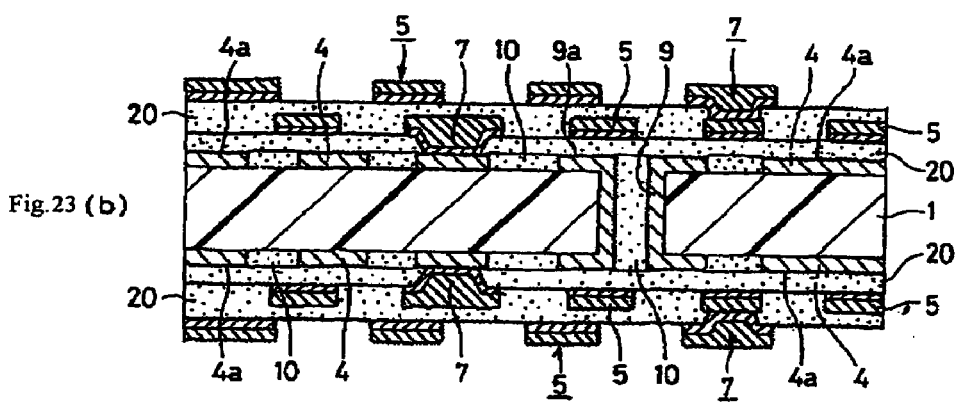
Figure 23C:
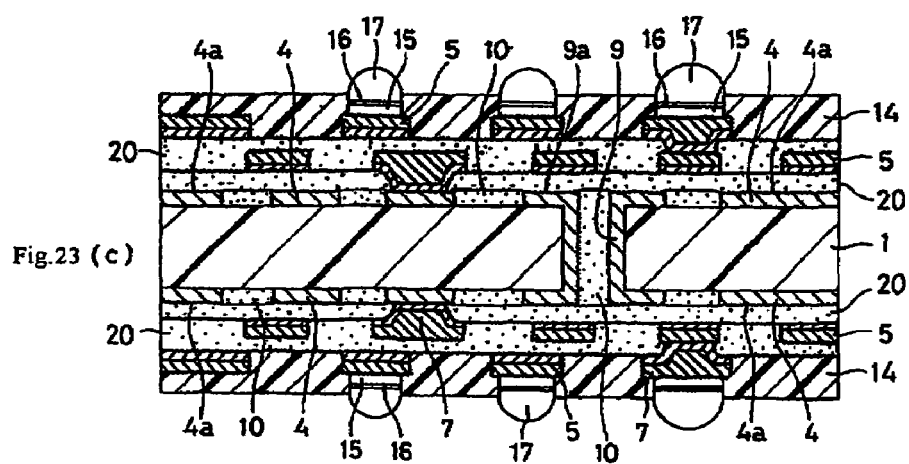

(9) Successively, the foregoing processes (2) to (8) were repeated to form resin insulating layers and conductive circuits in further upper layers and to obtain a multilayer printed circuit board (reference FIG. 22(*b*) to FIG. 23(*b*)).

(10) After that, the same processes as the processes (15) to (18) of the example 1 were carried out to manufacture a multilayer printed circuit board having solder bumps 17 (reference to FIG. 23(*c*)).

EXAMPLE 5

A multilayer printed circuit board was manufactured in approximately the same manner as the example 4 except that a film made of a resin composite composed of an epoxy resin (a thermosetting resin) and a phenoxy resin (a thermoplastic resin) was used as the film made of the resin composite.

EXAMPLE 6

A multilayer printed circuit board was manufactured in approximately the same manner as the example 1 except that 400 mg/L of gelatin and 150 ml/L of bisdisulfide were used as the additives for the electroplating solution.

EXAMPLE 7

A multilayer printed circuit board was manufactured in approximately the same manner as the example 2 except that 400 mg/L of gelatin and 150 ml/L of bisdisulfide were used as the additives for the electroplating solution.

EXAMPLE 8

A multilayer printed circuit board was manufactured in approximately the same manner as the example 3 except that 400 mg/L of gelatin and 150 ml/L of bisdisulfide were used as the additives for the electroplating solution.

EXAMPLE 9

A multilayer printed circuit board was manufactured in approximately the same manner as the example 1 except that 400 mg/L of polyethylene glycol and 150 ml/L of sulfonic acid amide were used as the additives for the electroplating solution.

EXAMPLE 10

A multilayer printed circuit board was manufactured in approximately the same manner as the example 2 except that 400 mg/L of polyethylene glycol and 150 ml/L of sulfonic acid amide were used as the additives for the electroplating solution.

EXAMPLE 11

A multilayer printed circuit board was manufactured in approximately the same manner as the example 3 except that 400 mg/L of polyethylene glycol and 150 ml/L of sulfonic acid amide were used as the additives for the electroplating solution.

EXAMPLE 12

A multilayer printed circuit board was manufactured in approximately the same manner as the example 5 except that 400 mg/L of gelatin and 150 ml/L of bisdisulfide were used as the additives for the electroplating solution.

EXAMPLE 13

A multilayer printed circuit board was manufactured in approximately the same manner as the example 5 except that 400 mg/L of polyethylene glycol and 150 ml/L of sulfonic acid amide were used as the additives for the electroplating solution.

COMPARATIVE EXAMPLE 1

A. Preparation of a resin composite (an adhesive for an upper layer), preparation of a resin composite (an adhesive for a lower layer) and preparation of a resin filler were carried out in the same manner as example 1.

B. Method for manufacturing printed circuit board (1) A layer of a resin composite with the thickness of 35 μm was formed in the same manner as described in processes (1) to (6) of the example 1 except that a substrate made of a glass epoxy resin or BT (bismaleimide triazine) resin with thickness of 0.6 mm (reference FIG. 2(a) to FIG. 3(b)) is used.

(2) Next, a resin insulating layer with the thickness of 35 μm having opening parts for via-holes with the diameter of 90 μm was formed in the same manner as described in the process (7) of the example 1 except that a photomask film printed with black circles with the diameter of 90 μm was closely applied to both sides of the substrate bearing the layer of the resin composite (reference FIG. 3(c)). Incidentally, a roughened surface of an under-level conductor circuit was exposed in the opening parts to be via-holes.

(3) Further, the substrate in which the opening parts for via-holes was conditioned and subjected to catalyst adhesion in an alkaline catalyst for 5 minutes and then the substrate was activated and immersed in an aqueous electroless copper plating solution with the following composition to form an electroless copper plating film with the thickness of 1.1 μm on the entire surface:

[Aqueous Electroless Plating Solution]

| | |
|---|---|
| $CuSO_4$-$5H_2O$ | 10 g/L |
| HCHO | 8 g/L |
| NaOH | 8 g/L |
| Rochelle salt | 45 g/L |
| an additive | 30 ml/L |

[The Electroless Plating Conditions]

at 34° C. solution temperature for 25 minutes.

(4) Next, electroplating of the entire surface of the electroless copper plating film was carried in the following conditions to form an electroplating film 13 with the thickness of 11 μm:

[The Aqueous Electroplating Solution]

| | |
|---|---|
| $CuSO_4$-$5H_2O$ | 80 g/L |
| sulfuric acid | 180 g/L |
| $Cl^-$ | 40 mg/L |
| additive | 0.5 ml/L |

[The Electroplating Conditions]

| | |
|---|---|
| current density | 1.0 A/dm$^2$ |
| duration | 50 minutes |
| temperature | 27° C. |

(5) A photosensitive dry film sold on the market was stuck to the electrolytic copper plating film, a mask was put thereon, exposure was carried out at 100 mJ/cm$^2$, and development treatment was carried out with an aqueous solution of 0.8% sodium carbonate to form an etching resist with the thickness of 20 μm and L/S=20/10 μm.

(6) Further, the parts other than conductor circuits were etched by spray etching using an aqueous sulfuric acid/hydrogen peroxide solution. Successively, the resist film was separated and removed in an aqueous solution of 40 g/L NaOH at 50° C. After that, the resultant substrate was subjected to heating treatment at 150° C. for 1 hour to form a 15 μm-thick conductor circuit composed of the metal layer and the electrolytic copper plating film and a filled via.

(7) The substrate in which the conductor circuit was formed was subjected to the same process as described in the process (5) to form roughened face with the thickness of 2 μm on the surface of the conductor circuit including the filled via.

(8) Successively, the processes (the processes (1) to (7) of the example 1) for forming a layer of the composite resin described in (1) were repeated to form further upper layer conductor circuits to obtain a multilayer printed circuit board with 8 layers.

(9) Next, in the same manner as the process (15) of the example 1, a solder resist resin composition was obtained.

Also, through the processes similar to the processes (16) to (18) of the example 1, a multilayer printed circuit board having solder bumps was manufactured.

The multilayer printed circuit boards having solder bumps obtained by the examples and the comparative examples were cut with a cutter and their cross-sections were observed by a microscope. In the case where the multilayer printed circuit boards having solder bumps according to the examples were cut with a cutter and their cross-sections were observed by a microscope, the difference between the height of upper faces of the conductor circuits and the height of the upper faces of the filled via-holes from the resin substrates was 1 μm or shorter to make it clear that both upper faces were to be approximately in the same plane and no recessed part was found to be formed in the upper faces of the via-holes. On the other hand, in the case of the multilayer printed circuit board according to the comparative example, the opening parts for the via-holes was not completely filled with a metal and recessed parts were found to be formed in the via-hole upper face.

Further, the multilayer printed circuit boards according to the examples had a stack via structure and as a result of a continuity test, the continuity was confirmed even in the part of the stack via structure. On the other hand, the multilayer printed circuit board according to the comparative example was found not to have continuity in the part of the stack via structure, as a result of a continuity test.

INDUSTRIAL APPLICABILITY

As described above regarding an electroplating solution of the present invention, an opening part for a via-hole can perfectly be filled with a metal and a via-hole can be formed with the upper face of the via-hole and the upper face of a conductor circuit in the same layer being kept approximately in the same plane by manufacturing a multilayer printed circuit board by using the electroplating solution.

Also, by the method for manufacturing a multilayer printed circuit board according to the first or second method of the present invention, an opening part for a via-hole can perfectly be filled with a metal and a via-hole can be formed with the upper face of the via-hole and the upper face of a conductor circuit in the same layer being kept approximately in the same plane and a multilayer printed circuit board having a stack via structure can be manufactured.

Further, in a multilayer printed circuit board of the present invention, since an opening part for a via-hole is perfectly filled with a metal and the upper face of the via-hole and the upper face of a conductor circuit in the same layer are kept approximately in the same plane, no separation and crack take place between a conductor circuit including a via-hole and a resin insulating layer and no disconnection of a conductor circuit in the upper layer of the former conductor circuit occurs, resulting in improvement of the connection reliability. Moreover, the foregoing multilayer printed circuit board can have a stack via structure with which the wiring distance is shortened in order to satisfy the requirements of the high speed and fine property of a printed circuit board.

The invention claimed is:

1. A method for manufacturing a multilayer printed circuit board of the present invention, characterized by containing at least the following processes (a) to (e):
   (a) a process of forming a resin insulating layer having an opening part for a via-hole by exposure and development treatment or laser treatment;
   (b) a process of forming a metal layer comprising at least one element selected from the group consisting of Cu, Ni, P, Pd, Co and W on the surface of the resin insulating layer and the opening part for a via-hole;
   (c) a process of forming a plating resist on said metal layer;
   (d) a process of forming an electroplating film on a part un-coated with said plating resist using an electroplating solution containing: 50 to 300 g/L of copper sulfate, 30 to 200 g/L of sulfuric acid, 25 to 90 mg/L of chlorine ion, and 1 to 1000 mg/L of an additive comprising at least a leveling agent and a brightener; and
   (e) a process of forming a conductor circuit by etching the metal layer existing under said plating resist after said plating resist is separated.

2. The method for manufacturing a multilayer printed circuit board according to claim 1, characterized in that the metal layer is formed by sputtering, plating, or sputtering and plating in combination in said process (b).

3. The method for manufacturing a multilayer printed circuit board according to claim 1, characterized in that the resin insulating layer is made of at least one resin selected from the group consisting of a fluoro resin, a polyolefin type resin, and a polyphenylene type resin.

4. The method for manufacturing a multilayer printed circuit board according to claim 1, characterized in that the resin insulating layer is made of a resin complex containing a thermoplastic resin and a thermosetting resin.

5. The method for manufacturing a multilayer printed circuit board according to claim 1, characterized by using at least one substance selected from the group consisting of polyethylene, its derivatives, gelatin, and its derivatives as the leveling agent for said electroplating solution.

6. The method for manufacturing a multilayer printed circuit board according to claim 1, characterized by using at least one compound selected from the group consisting of sulfur oxide, compounds related to sulfur oxide, hydrogen sulfide, compounds related to hydrogen sulfide, and other sulfur compounds as the brightener for said electroplating solution.

7. A method for manufacturing a multilayer printed circuit board, characterized by containing at least the following processes (a) to (d):
   (a) a process of forming a resin insulating layer having an opening part for a via-hole by exposure and development treatment or laser treatment;
   (b) a process of forming a metal layer comprising at least one element selected from the group consisting of Cu, Ni, P, Pd, Co and W on the surface of the resin insulating layer and the opening part for a via-hole;
   (c) a process of forming an electroplating film on said metal layer using an electroplating solution containing: 50 to 300 g/L of copper sulfate, 30 to 200 g/L of sulfuric acid, 25 to 90 mg/L of chlorine ion, and 1 to 1000 mg/L of an additive comprising at least a leveling agent and a brightener; and
   (d) a process of forming a conductor circuit by etching after an etching resist is formed on said electroplating film.

8. The method for manufacturing a multilayer printed circuit board according to claim 7, characterized in that the metal layer is formed by sputtering, plating, or sputtering and plating in combination in said process (b).

9. A multilayer printed circuit board comprising a substrate bearing a conductor circuit and, as serially layered thereon, a resin insulating layer and a conductor circuit in an alternate fashion and in repetition,
   wherein the conductor circuits neighboring in up and down direction are connected through a via-hole,
   said via-hole is filled with a metal,
   the upper face of said via-hole and the upper face of said conductor circuit in the same layer are kept approximately in the same plane,
   the distance from the bottom face to the upper face of said via-hole is about 2 to 7 times as long as the thickness of said conductor circuit, and
   said multilayer printed circuit board is manufactured by a method characterized by containing at least the following processes (a) to (e):
   (a) a process of forming a resin insulating layer having an opening part for a via-hole by exposure and development treatment or laser treatment;
   (b) a process of forming a metal layer comprising at least one element selected from the group consisting of Cu, Ni, P, Pd, Co and W on the surface of the resin insulating layer and the opening part for a via-hole;
   (c) a process of forming a plating resist on said metal layer;
   (d) a process of forming an electroplating film on a part un-coated with said plating resist using an electroplating solution containing: 50 to 300 g/L of copper sulfate, 30 to 200 g/L of sulfuric acid, 25 to 90 mg/L of chlorine ion, and 1 to 1000 mg/L of an additive comprising at least a leveling agent and a brightener; and
   (e) a process of forming a conductor circuit by etching the metal layer existing under said plating resist after said plating resist is separated.

10. A multilayer printed circuit board comprising a substrate bearing a conductor circuit and, as serially layered thereon, a resin insulating layer and a conductor circuit in an alternate fashion and in repetition, wherein the conductor circuits neighboring in up and down direction are connected through a via-hole, said via-hole is filled with a metal, the upper face of said via-hole and the upper face of said conductor circuit in the same layer are kept approximately in the same plane, the distance from the bottom face to the upper face of said via-hole is about 2 to 7 times as long the thickness of said conductor circuit, said resin insulating layer has a dielectric constant of 3.0 or lower at 1 GHz, and said multilayer printed circuit board is manufactured by a method characterized by containing at least the following processes (a) to (e):

(a) a process of forming a resin insulating layer having an opening part for a via-hole by exposure and development treatment or laser treatment;

(b) a process of forming a metal layer comprising at least one element selected from the group consisting of Cu, Ni, P, Pd, Co and W on the surface of the resin insulating layer and the opening part for a via-hole;

(c) a process of forming a plating resist on said metal layer;

(d) a process of forming an electroplating film on a part un-coated with said plating resist using an electroplating solution containing: 50 to 300 g/L of copper sulfate, 30 to 200 g/L of sulfuric acid, 25 to 90 mg/L of chlorine ion, and 1 to 1000 mg/L of an additive comprising at least a leveling agent and a brightener; and (e) a process of forming a conductor circuit by etching the metal layer existing under said plating resist after said plating resist is separated.

* * * * *